(12) United States Patent
Seo

(10) Patent No.: US 9,747,959 B2
(45) Date of Patent: Aug. 29, 2017

(54) STACKED MEMORY DEVICES, AND MEMORY PACKAGES AND MEMORY SYSTEMS HAVING THE SAME

(71) Applicant: Samsung Electronics Co., Ltd., Suwon-si OT (KR)

(72) Inventor: Seong-Min Seo, Seoul (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/357,041

(22) Filed: Nov. 21, 2016

(65) Prior Publication Data

US 2017/0154655 A1    Jun. 1, 2017

(30) Foreign Application Priority Data

Nov. 26, 2015 (KR) ........................ 10-2015-0166045

(51) Int. Cl.
| | |
|---|---|
| G11C 5/14 | (2006.01) |
| H01L 25/065 | (2006.01) |
| G11C 7/22 | (2006.01) |
| G11C 8/10 | (2006.01) |
| G11C 5/02 | (2006.01) |
| G11C 8/06 | (2006.01) |

(52) U.S. Cl.
CPC ............... *G11C 5/147* (2013.01); *G11C 5/02* (2013.01); *G11C 7/22* (2013.01); *G11C 8/06* (2013.01); *G11C 8/10* (2013.01); *H01L 25/0657* (2013.01); *H01L 2225/06513* (2013.01); *H01L 2225/06541* (2013.01)

(58) Field of Classification Search
USPC ................ 365/226, 227, 228; 361/735, 803; 257/777, 774
See application file for complete search history.

(56) References Cited

U.S. PATENT DOCUMENTS

| | | |
|---|---|---|
| 5,083,187 A | 1/1992 | Lamson et al. |
| 7,598,617 B2 | 10/2009 | Lee et al. |
| 8,125,068 B2 | 2/2012 | Lee |
| 8,519,470 B2 | 8/2013 | Kang et al. |
| 8,691,600 B2 | 4/2014 | Liu |
| 2004/0207082 A1 | 10/2004 | Yamano et al. |
| 2007/0155048 A1 | 7/2007 | Lee et al. |

(Continued)

*Primary Examiner* — Vu Le
(74) *Attorney, Agent, or Firm* — Muir Patent Law, PLLC

(57) ABSTRACT

A stacked memory device includes a master semiconductor die and a plurality of slave semiconductor dies stacked on the master semiconductor die. The master semiconductor die includes a first power line coupled to a first power supply voltage, a second power line coupled to a second power supply voltage, a memory device coupled to the first power line, and a data input/output buffer coupled to the second power line. Each of the plurality of slave semiconductor dies includes third and fourth power lines and a memory device coupled to the third power line. The third power line is electrically connected to the first and fourth power lines, and the fourth power line is electrically disconnected from the second power line. The data input/output buffer buffers data communicated between an external device and the memory devices included in the master semiconductor die and the plurality of slave semiconductor dies.

20 Claims, 16 Drawing Sheets

(56) References Cited

U.S. PATENT DOCUMENTS

| | | |
|---|---|---|
| 2008/0105984 A1 | 5/2008 | Lee |
| 2010/0207278 A1 | 8/2010 | Kwon et al. |
| 2011/0110064 A1* | 5/2011 | Foster, Sr. ............ H01L 23/481 |
| | | 361/803 |
| 2011/0272788 A1 | 11/2011 | Kim et al. |
| 2012/0069530 A1* | 3/2012 | Inoue .................... G11C 5/025 |
| | | 361/735 |
| 2012/0105093 A1 | 5/2012 | Lee |
| 2012/0138927 A1* | 6/2012 | Kang ............ G01R 31/318513 |
| | | 257/48 |
| 2015/0168972 A1 | 6/2015 | Mathiyalagan et al. |

* cited by examiner

STACKED MEMORY DEVICES, AND MEMORY PACKAGES AND MEMORY SYSTEMS HAVING THE SAME

CROSS-REFERENCE TO RELATED APPLICATION(S)

This application claims priority under 35 USC §119 to Korean Patent Application No. 10-2015-0166045, filed on Nov. 26, 2015 in the Korean Intellectual Property Office (KIPO), the contents of which are herein incorporated by reference in their entirety.

BACKGROUND

1. Technical Field

Example embodiments relate to a semiconductor device, and more particularly to a stacked memory device, and a memory package and a memory system having the stacked memory device.

2. Description of the Related Art

As a capacity of a semiconductor memory device increases, a stacked memory device, in which semiconductor dies including memory cells are stacked on each other, has been developed.

In a conventional stacked memory device, a power supply voltage is transferred from a lower semiconductor die to an upper semiconductor die. Therefore, a path of the upper semiconductor die through which the upper semiconductor die receives the power supply voltage may be longer than a path of the lower semiconductor die through which the lower semiconductor die receives the power supply voltage.

As such, a magnitude of the power supply voltage transferred to the upper semiconductor die may be smaller than a magnitude of the power supply voltage transferred to the lower semiconductor die due to a voltage drop on the path.

SUMMARY

Some example embodiments are directed to provide a stacked memory device that has increased power characteristics.

Some example embodiments are directed to provide a memory system including the stacked memory device.

Some example embodiments are directed to provide a memory package including the stacked memory device.

According to example embodiments, a stacked memory device includes a master semiconductor die and a plurality of slave semiconductor dies. The master semiconductor die includes a first power line coupled to a first power supply voltage provided from outside of the stacked memory device, a second power line coupled to a second power supply voltage provided from outside of the stacked memory device, a memory device coupled to the first power line, and a first data input/output buffer coupled to the second power line. The plurality of slave semiconductor dies are stacked on the master semiconductor die. Each of the plurality of slave semiconductor dies includes a third power line, a fourth power line, and a memory device coupled to the third power line. The third power line is electrically connected to the first power line, the fourth power line is electrically disconnected from the second power line, and the third power line is electrically connected to the fourth power line. The data input/output buffer buffers data communicated between an external device and the memory devices included in the master semiconductor die and the plurality of slave semiconductor dies.

According to example embodiments, a memory package includes a base substrate, a master semiconductor die, and a plurality of slave semiconductor dies. The base substrate receives a first power supply voltage and a second power supply voltage. The master semiconductor die is stacked on the base substrate, and receives the first power supply voltage and the second power supply voltage from the base substrate. The plurality of slave semiconductor dies are stacked on the master semiconductor die. The master semiconductor die includes a first power line coupled to the first power supply voltage, a second power line coupled to the second power supply voltage, a memory device coupled to the first power line, and a data input/output circuit coupled to the second power line. Each of the plurality of slave semiconductor dies includes a third power line electrically connected to the first power line, a fourth power line electrically disconnected from the second power line and electrically connected to the third power line, and a memory device coupled to the third power line. The data input/output circuit included in the master semiconductor die buffers data communicated between an external device and the memory devices included in the master semiconductor die and each of the plurality of slave semiconductor dies.

According to example embodiments, a memory system includes a memory controller and a stacked memory device controlled by the memory controller. The stacked memory device includes a master semiconductor die and a plurality of slave semiconductor dies. The master semiconductor die includes a first power line coupled to a first power supply voltage provided from outside of the stacked memory device, a second power line coupled to a second power supply voltage provided from outside of the stacked memory device, a memory device coupled to the first power line, and a data input/output buffer coupled to the second power line. The plurality of slave semiconductor dies are stacked on the master semiconductor die. Each of the plurality of slave semiconductor dies includes a third power line, a fourth power line, and a memory device coupled to the third power line. The third power line is electrically connected to the first power line, the fourth power line is electrically disconnected from the second power line, and the third power line is electrically connected to the fourth power line. The data input/output buffer buffers data communicated between the memory controller and the memory devices included in the master semiconductor die and each of the plurality of slave semiconductor dies.

According to example embodiments, a stacked memory device includes: a master semiconductor die including a first power line coupled to a first power supply voltage provided from outside of the stacked memory device, a second power line coupled to a second power supply voltage provided from outside of the stacked memory device, a first charge storage circuit and a first memory device both coupled to the first power line, and a first data input/output circuit coupled to the second power line, wherein the first memory device is provided in parallel with the first charge storage circuit; and a plurality of slave semiconductor dies stacked on the master semiconductor die, each of the plurality of slave semiconductor dies including a third power line, a fourth power line, a third charge storage circuit coupled to the third power line and a second memory device coupled to the third power line, wherein the second memory device is provided in parallel with the third charge storage circuit, wherein the third power line is electrically connected to the first power line, the fourth power line is electrically disconnected from the second power line, and the third power line is electrically connected to the fourth power line, and wherein the first data input/output circuit is configured to buffer data communicated between an external device and the first memory device included in the master semiconductor die and the second memory device included in each of the plurality of slave semiconductor dies.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
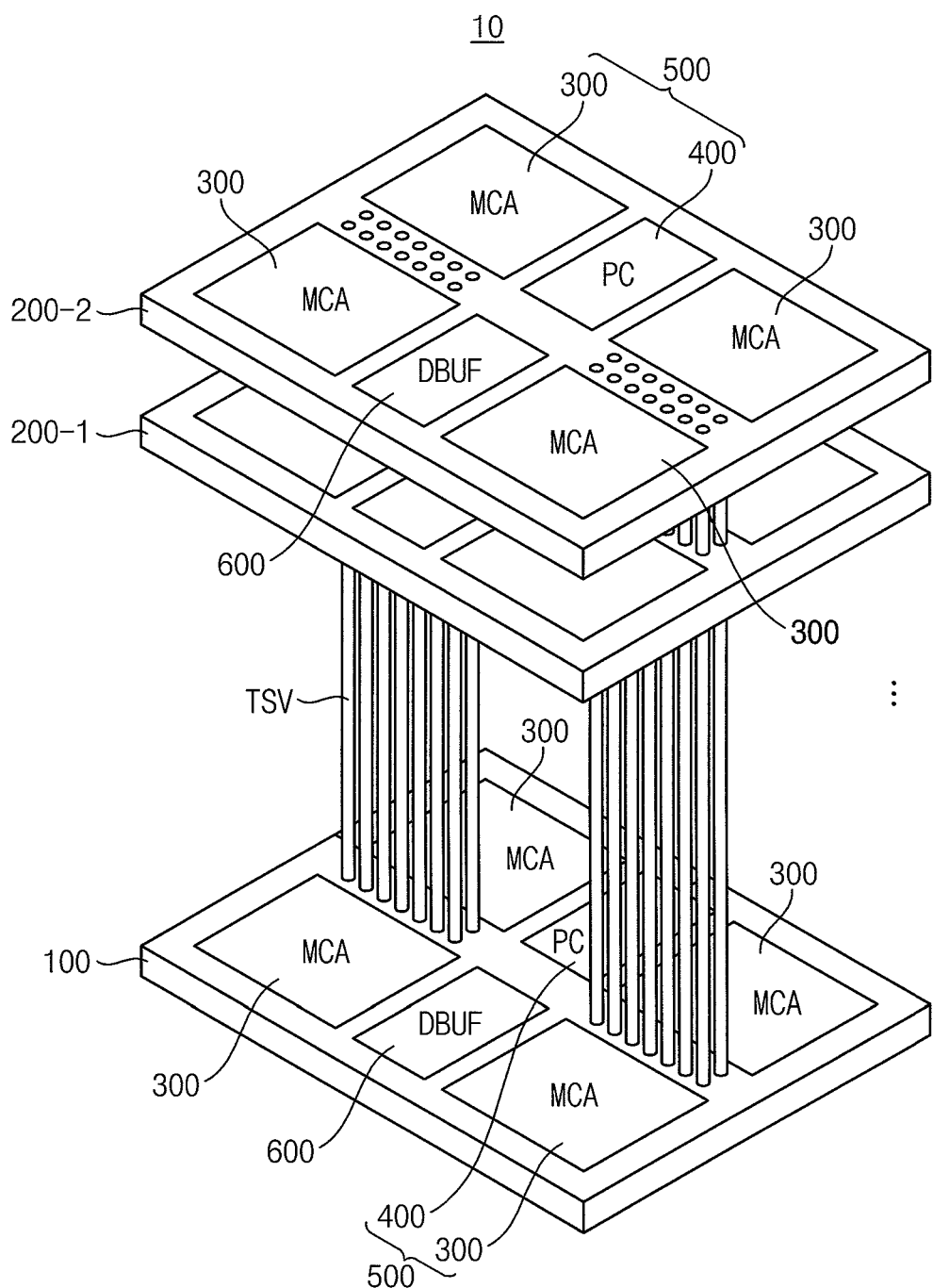
FIG. 1 is a diagram illustrating a three dimensional structure of a stacked memory device according to example embodiments.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a diagram illustrating a three dimensional structure of a stacked memory device according to example embodiments.

Referring to FIG. 1, a stacked memory device 10 includes a master semiconductor die 100 and a plurality of slave semiconductor dies 200-1 and 200-2 stacked on the master semiconductor die 100.

The master semiconductor die 100 and the plurality of slave semiconductor dies 200-1 and 200-2 may be electrically connected to each other by through silicon vias (TSVs) to communicate with each other through the TSVs. Through silicon vias may be more generally referred to herein as through substrate vias, which may also be described as TSVs.

The master semiconductor die 100 may communicate with an external device (not shown) through a conductive structure formed on an external surface.

For example, the master semiconductor die 100 may receive a power supply voltage from outside the stacked memory device 10, and transfer the power supply voltage to the plurality of slave semiconductor dies 200-1 and 200-2 through the TSVs.

Figure 12:
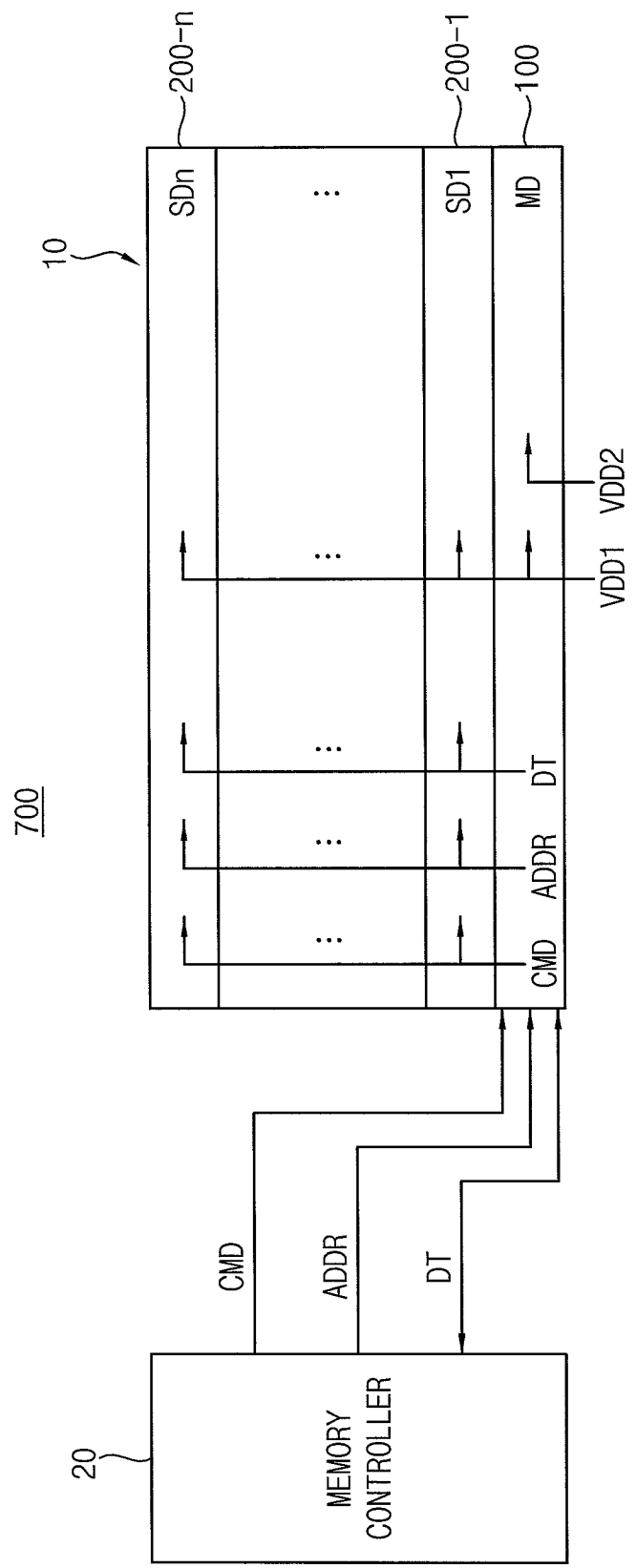
FIG. 12 is a block diagram illustrating a memory system according to example embodiments.

In addition, the master semiconductor die 100 may receive a command signal and an address signal from an external memory controller (e.g., memory controller 20 as shown in FIG. 12), and transfer the command signal and the address signal to the plurality of slave semiconductor dies 200-1 and 200-2 through the TSVs. In a write mode, the master semiconductor die 100 may receive data from the external memory controller, and transfer the data to the plurality of slave semiconductor dies 200-1 and 200-2 through the TSVs. In a read mode, the master semiconductor die 100 may receive data from the plurality of slave semiconductor dies 200-1 and 200-2 through the TSVs, and provide the data to the external memory controller.

The master semiconductor die 100 and each of the plurality of slave semiconductor dies 200-1 and 200-2 may include a memory device formed in a same structure. For example, the master semiconductor die 100 and each of the plurality of slave semiconductor dies 200-1 and 200-2 may include a memory cell array and circuit blocks, which are formed in a same structure and in a same arrangement by a same process. Semiconductor dies formed in the same process may be classified as the master semiconductor die 100 and the plurality of slave semiconductor dies 200-1 and 200-2 according to connections between power lines and connections between the circuit blocks formed on the master semiconductor die 100 and each of the plurality of slave semiconductor dies 200-1 and 200-2.

In some example embodiments, the master semiconductor die 100 and each of the plurality of slave semiconductor dies 200-1 and 200-2 may include at least one memory cell array MCA 300, a peripheral circuit PC 400 controlling an operation of the at least one memory cell array 300, and a data input/output buffer DBUF 600. For example, the peripheral circuit 400 may include a row decoder driving word lines of the at least one memory cell array 300, a column decoder driving bit lines of the at least one memory cell array 300, a command decoder decoding the command signal received from the external memory controller, an address register buffering the address signal received from the external memory controller, etc.

As illustrated in FIG. 1, a memory device 500, which includes the at least one memory cell array 300 and the peripheral circuit 400, and the data input/output buffer 600 may be formed in the master semiconductor die 100 and each of the plurality of slave semiconductor dies 200-1 and 200-2 in a same arrangement.

As described above, since data communication between the stacked memory device 10 and the external memory controller is performed through the master semiconductor die 100, the data input/output buffer 600 included in each of the plurality of slave semiconductor dies 200-1 and 200-2 may be deactivated, and the data input/output buffer 600 included in the master semiconductor die 100 may buffer data communicated between the external memory controller and the memory device 500 included in the master semiconductor die 100 and each of the plurality of slave semiconductor dies 200-1 and 200-2.

In some example embodiments, the stacked memory device 10 may have a 3DS (three dimensional stack) structure defined by a JEDEC (joint electron device engineering council) standard. For example, the master semiconductor die 100 and the plurality of slave semiconductor dies 200-1 and 200-2 may be stacked according to the 3DS structure defined by the JEDEC standard.

Although FIG. 1 illustrates that the stacked memory device 10 includes two slave semiconductor dies 200-1 and 200-2 stacked on the master semiconductor die 100 as an example, example embodiments are not limited thereto. According to example embodiments, the stacked memory device 10 may include any number of slave semiconductor dies 200-1 and 200-2 stacked on the master semiconductor die 100 (e.g., 3, 4, 5, 6, 7, 8, etc.).

In addition, the arrangement of the at least one memory cell array 300, the peripheral circuit 400, and the data input/output buffer 600 formed on the master semiconductor die 100 and each of the plurality of slave semiconductor dies 200-1 and 200-2 of FIG. 1 is only an example, and example embodiments are not limited thereto. According to example embodiments, the at least one memory cell array 300, the peripheral circuit 400, and the data input/output buffer 600 formed on the master semiconductor die 100 and each of the plurality of slave semiconductor dies 200-1 and 200-2 may be disposed in various arrangements. In these embodiments, the arrangement of these components of the different dies may still be the same in relation to each other, so that the dies have the same circuit layouts and structures for these components.

Figure 2:
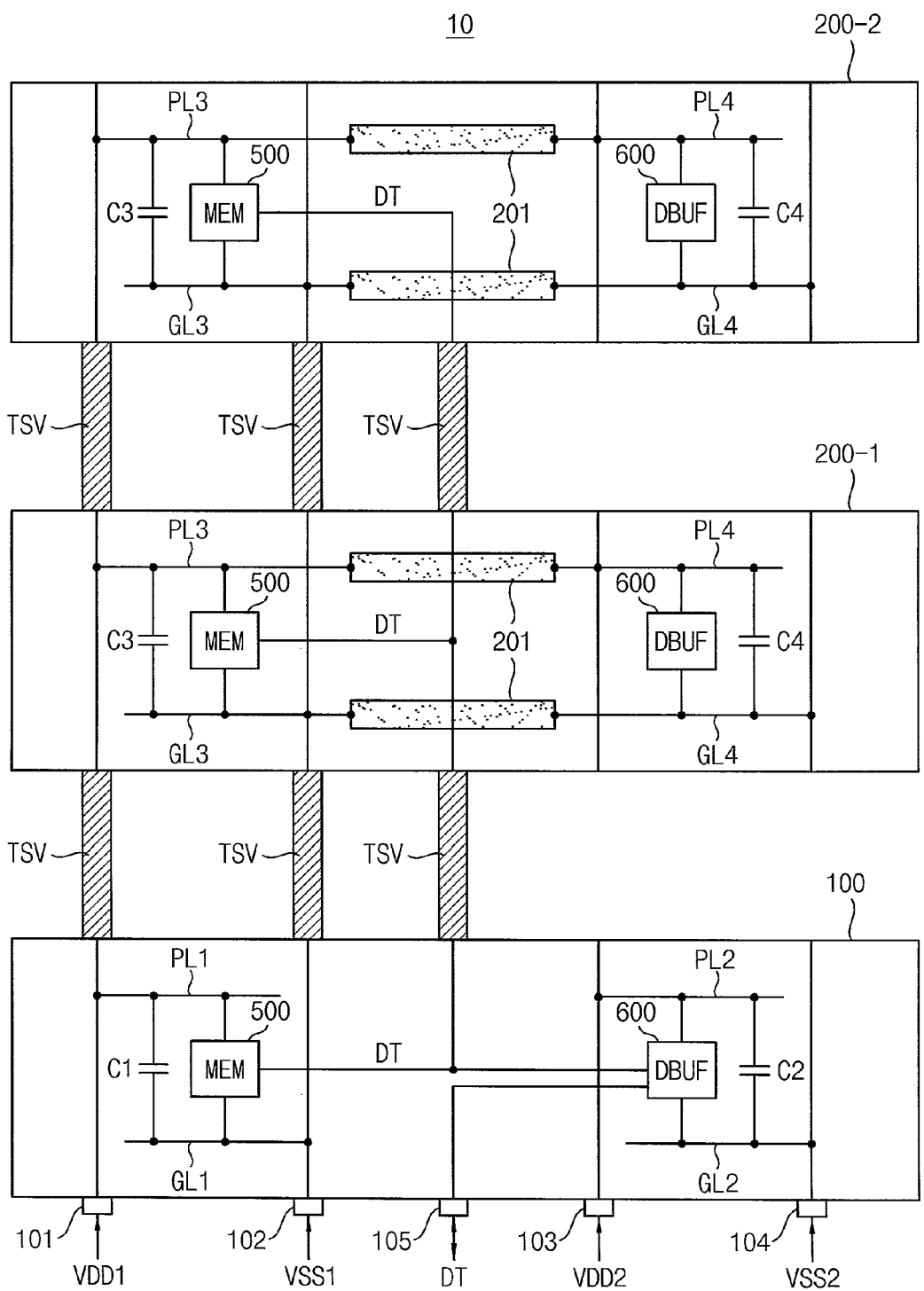
FIG. 2 is a block diagram illustrating a stacked memory device according to example embodiments.

FIG. 2 is a block diagram illustrating a stacked memory device according to example embodiments.

FIG. 2 illustrates an internal structure of the stacked memory device 10 of FIG. 1. Referring to FIG. 2, a first power line PL1, a first ground line GL1, a second power line PL2, and a second ground line GL2 may be formed on the master semiconductor die 100, and a third power line PL3, a third ground line GL3, a fourth power line PL4, and a fourth ground line GL4 may be formed on each of the plurality of slave semiconductor dies 200-1 and 200-2.

In some example embodiments, the first power line PL1, the first ground line GL1, the second power line PL2, and the second ground line GL2 included in the master semiconductor die 100 may be formed by a same process as the third power line PL3, the third ground line GL3, the fourth power line PL4, and the fourth ground line GL4 included in each of the plurality of slave semiconductor dies 200-1 and 200-2, respectively. Therefore, the first power line PL1, the first ground line GL1, the second power line PL2, and the second ground line GL2 included in the master semiconductor die 100 may have a same arrangement as the third power line PL3, the third ground line GL3, the fourth power line PL4, and the fourth ground line GL4 included in each of the plurality of slave semiconductor dies 200-1 and 200-2. The terms first, second, third, and fourth are used here as a naming convention only. Each die may have its own separate ground line from the other dies and its own separate power line from the other dies.

The memory device MEM 500, which includes the at least one memory cell array 300 and the peripheral circuit 400, included in the master semiconductor die 100 may be coupled between the first power line PL1 and the first ground line GL1. The data input/output buffer 600 included in the master semiconductor die 100 may be coupled between the second power line PL2 and the second ground line GL2.

The memory device MEM 500, which includes the at least one memory cell array 300 and the peripheral circuit 400, included in each of the plurality of slave semiconductor dies 200-1 and 200-2 may be coupled between the third power line PL3 and the third ground line GL3. The data input/output buffer 600 included in each of the plurality of slave semiconductor dies 200-1 and 200-2 may be coupled between the fourth power line PL4 and the fourth ground line GL4.

In some example embodiments, the master semiconductor die 100 may further include a first charge storage unit, e.g., a first charge storage circuit, which may consist of or may include a first power capacitor C1, which is coupled between the first power line PL1 and the first ground line GL1, and a second charge storage unit, e.g., a second charge storage circuit, which may consist of or may include a second power capacitor C2, which is coupled between the second power line PL2 and the second ground line GL2. Each of plurality of slave semiconductor dies 200-1 and 200-2 may further include a third charge storage unit, e.g., a third charge storage circuit, which may consist of or may include a third power capacitor C3, which is coupled between the third power line PL3 and the third ground line GL3, and a fourth charge storage unit, e.g., a fourth charge storage circuit, which may consist of or may include a fourth power capacitor C4, which is coupled between the fourth power line PL4 and the fourth ground line GL4.

The first power capacitor C1, the second power capacitor C2, the third power capacitor C3, and the fourth power capacitor C4 may suppress a temporary decrease of a voltage of the first power line PL1, the second power line PL2, the third power line PL3, and the fourth power line PL4, respectively, caused by operations of the memory device 500 and the data input/output buffer 600.

The master semiconductor die 100 may receive a first power supply voltage VDD1, a first ground voltage VSS1, a second power supply voltage VDD2, and a second ground voltage VSS2 through a first external pad 101, a second external pad 102, a third external pad 103, and a fourth external pad 104, respectively.

In the master semiconductor die 100, the first power line PL1 may be coupled to the first power supply voltage VDD1, the first ground line GL1 may be coupled to the first ground voltage VSS1, the second power line PL2 may be coupled to the second power supply voltage VDD2, and the second ground line GL2 may be coupled to the second ground voltage VSS2. In some example embodiments, the first power line PL1 may be electrically disconnected from the second power line PL2, and the first ground line GL1 may be electrically disconnected from the second ground line GL2. Therefore, in the master semiconductor die 100, the memory device 500 may operate using the first power supply voltage VDD1 provided through the first power line PL1, and the data input/output buffer 600 may operate using the second power supply voltage VDD2 provided through the second power line PL2. The first power line PL1 may receive the first power supply voltage VDD1 independently from the second power supply voltage VDD2, and the second power line PL2 may receive the second power supply voltage VDD2 independently from the first power supply voltage VDD1. The second power supply voltage VDD2 may be dedicated to the master semiconductor die 100 (e.g., the bottom die closest to a package substrate), such that it is not received by the slave semiconductor dies 200-1 to 200-2.

The third power line PL3 included in each of the plurality of slave semiconductor dies 200-1 and 200-2 may be electrically connected to the first power line PL1 included in the master semiconductor die 100, and the third ground line GL3 included in each of the plurality of slave semiconductor dies 200-1 and 200-2 may be electrically connected to the first ground line GL1 included in the master semiconductor die 100.

In some example embodiments, as illustrated in FIG. 2, the third power line PL3 included in each of the plurality of slave semiconductor dies 200-1 and 200-2 may be electrically connected to the first power line PL1 included in the master semiconductor die 100 through a TSV, and the third ground line GL3 included in each of the plurality of slave semiconductor dies 200-1 and 200-2 may be electrically connected to the first ground line GL1 included in the master semiconductor die 100 through a TSV.

In some example embodiments, as illustrated in FIG. 2, a TSV may not be formed between the fourth power line PL4 included in each of the plurality of slave semiconductor dies 200-1 and 200-2 and the second power line PL2 included in the master semiconductor die 100, and a TSV may not be formed between the fourth ground line GL4 included in each of the plurality of slave semiconductor dies 200-1 and 200-2 and the second ground line GL2 included in the master semiconductor die 100.

Therefore, the fourth power line PL4 included in each of the plurality of slave semiconductor dies 200-1 and 200-2 may be electrically disconnected from the second power line PL2 included in the master semiconductor die 100, and the fourth ground line GL4 included in each of the plurality of slave semiconductor dies 200-1 and 200-2 may be electrically disconnected from the second ground line GL2 included in the master semiconductor die 100.

In some example embodiments, as illustrated in FIG. 2, the third power line PL3 and the fourth power line PL4 included in each of the plurality of slave semiconductor dies 200-1 and 200-2 may be electrically connected to each other by a connection structure 201, and the third ground line GL3 and the fourth ground line GL4 included in each of the plurality of slave semiconductor dies 200-1 and 200-2 may be electrically connected to each other by a connection structure 201. Various embodiments of the connection structure 201 will be described later with reference to FIGS. 6 to 11.

Therefore, the first power supply voltage VDD1 may be provided to the third power line PL3 and the fourth power line PL4, and the first ground voltage VSS1 may be provided to the third ground line GL3 and the fourth ground line GL4.

As such, the memory device 500 included in each of the plurality of slave semiconductor dies 200-1 and 200-2 may operate using the first power supply voltage VDD1 provided through the third power line PL3 and the fourth power line PL4.

In some example embodiments, the data input/output buffer 600 included in each of the plurality of slave semiconductor dies 200-1 and 200-2 may be deactivated, and the memory device 500 included in each of the plurality of slave semiconductor dies 200-1 and 200-2 may communicate data with the external memory controller through the data input/output buffer 600 included in the master semiconductor die 100.

For example, in the write mode, the master semiconductor die 100 may receive data DT from the external memory controller through a data pad 105, and the data input/output buffer 600 included in the master semiconductor die 100 may buffer the data DT and provide the data DT to the memory device 500 included in the master semiconductor die 100 and each of the plurality of slave semiconductor dies 200-1 and 200-2. In this exemplary embodiment, the data DT output by the data input/output buffer 600 included in the master semiconductor die 100 may be provided to the memory device 500 included in each of the plurality of slave semiconductor dies 200-1 and 200-2 through a TSV. The data DT may be written in the memory device 500 included in a semiconductor die selected from among the master semiconductor die 100 and the plurality of slave semiconductor dies 200-1 and 200-2 based on a chip select signal.

In the read mode, data DT read from the memory device 500, which is included in a semiconductor die selected from among the master semiconductor die 100 and the plurality of slave semiconductor dies 200-1 and 200-2 based on a chip select signal, may be transferred to the data input/output buffer 600 included in the master semiconductor die 100. In this exemplary embodiment, the data DT read from the memory device 500 included in one of the plurality of slave semiconductor dies 200-1 and 200-2 may be transferred to the data input/output buffer 600 included in the master semiconductor die 100 through a TSV. The data input/output buffer 600 included in the master semiconductor die 100 may provide the data DT to the external memory controller through the data pad 105.

As described above, the data input/output buffer 600 included in the master semiconductor die 100 may buffer data DT communicated between the external memory controller and the memory device 500 included in the master semiconductor die 100 and each of the plurality of slave semiconductor dies 200-1 and 200-2.

Figure 3:
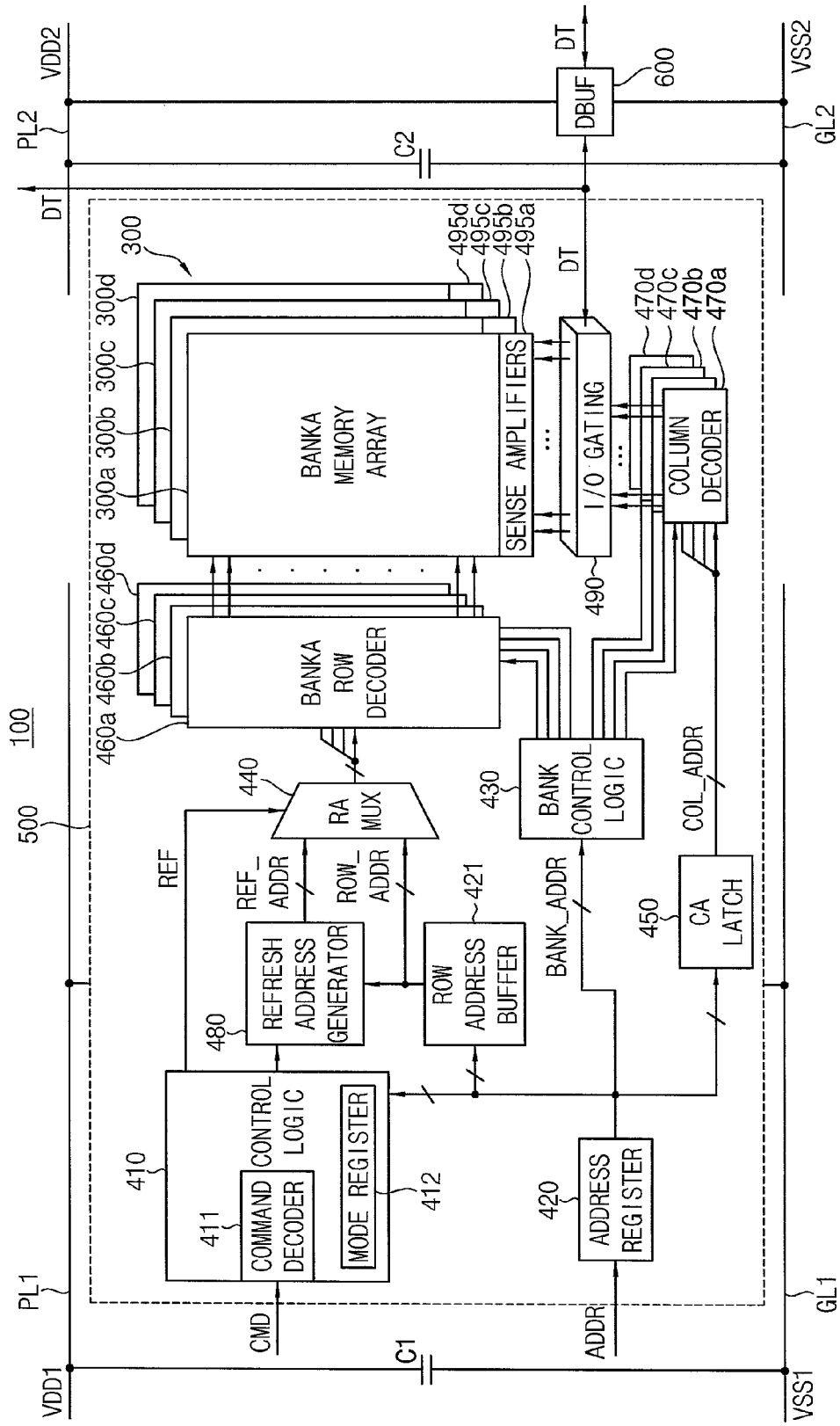
FIG. 3 is a block diagram illustrating an example embodiment of a master semiconductor die included in the stacked memory device of FIG. 2.

FIG. 3 is a block diagram illustrating an example embodiment of a master semiconductor die 100 included in the stacked memory device 10 of FIG. 2.

Referring to FIG. 3, the master semiconductor die 100 may include the memory device 500, the data input/output buffer 600, the first power capacitor C1, and the second power capacitor C2.

The memory device 500 and the first power capacitor C1 may be coupled between the first power line PL1 and the first ground line GL1, and the data input/output buffer 600 and the second power capacitor C2 may be coupled between the second power line PL2 and the second ground line GL2.

As described above with reference to FIG. 2, the first power supply voltage VDD1 may be provided to the first power line PL1, the first ground voltage VSS1 may be provided to the first ground line GL1, the second power supply voltage VDD2 may be provided to the second power line PL2, and the second ground voltage VSS2 may be provided to the second ground line GL2. In addition, the first power line PL1 and the second power line PL2 may be electrically disconnected from each other, and the first ground line GL1 and the second ground line GL2 may be electrically disconnected from each other. For example, there may be no conductive line or conductive material connected between a node receiving the first ground voltage VSS1 and a node receiving the second ground voltage VSS2 to electrically connect the two nodes, and there may be no conductive line or conductive material connected between a node receiving the first power supply voltage VDD1 and a node receiving the second power supply voltage VDD2 to electrically connect the two nodes.

Therefore, the memory device 500 may operate using the first power supply voltage VDD1, and the data input/output buffer 600 may operate using the second power supply voltage VDD2.

The first power capacitor C1 may suppress a temporary decrease of a voltage of the first power line PL1 when the memory device 500 operates using charges provided from the first power line PL1. In addition, the second power capacitor C2 may suppress a temporary decrease of a voltage of the second power line PL2 when the data input/output buffer 600 operates using charges provided from the second power line PL2. For example, in some embodiments, the first power capacitor C1 may provide additional charges to the first power line PL1 to drive the memory device 500 included in the master semiconductor die 100 when an operating voltage of the memory device 500 drops below the first power supply voltage VDD1. In some embodiments, the second power capacitor C2 may provide additional charges to the second power line PL2 to drive the data input/output buffer 600 when an operating voltage of the data input/output buffer 600 falls below the second power supply voltage VDD2.

The memory device 500 may include the memory cell array 300 and the peripheral circuit 400. In some embodiments, the peripheral circuit 400 may include a control logic 410, an address register 420, a row address buffer 421, a bank control logic 430, a row address multiplexer 440, a column address latch 450, a row decoder, a column decoder, a refresh address generator 480, an input/output gating circuit 490, and a sense amplifier.

The memory cell array 300 may include first through fourth bank arrays 300a, 300b, 300c and 300d. Each of the first through fourth bank arrays 300a, 300b, 300c and 300d may include a plurality of memory blocks. Each of the plurality of memory blocks may include a plurality of pages.

The row decoder may include first through fourth bank row decoders 460a, 460b, 460c and 460d respectively coupled to the first through fourth bank arrays 300a, 300b, 300c and 300d. The column decoder may include first through fourth bank column decoders 470a, 470b, 470c and 470d respectively coupled to the first through fourth bank arrays 300a, 300b, 300c and 300d. The sense amplifier may include first through fourth bank sense amplifiers 495a, 495b, 495c and 495d respectively coupled to the first through fourth bank arrays 300a, 300b, 300c and 300d.

The first through fourth bank arrays 300a, 300b, 300c and 300d, the first through fourth bank row decoders 460a, 460b, 460c and 460d, the first through fourth bank column decoders 470a, 470b, 470c and 470d and the first through fourth bank sense amplifiers 495a, 495b, 495c and 495d may form first through fourth banks. Although the memory device 500 is illustrated in FIG. 3 as including four banks, the memory device 500 may include any number of banks. For example, the memory device 500 may include more than four banks or less than four banks.

The control logic 410 may control operations of the memory device 500. For example, the control logic 410 may generate control signals for the memory device 500 to perform a write operation or a read operation. The control logic 410 may include a command decoder 411, which decodes a command signal CMD received from an external memory controller, and a mode register 412, which is used to set an operation mode of the memory device 500. For example, the command decoder 411 may generate the control signals corresponding to the command signal CMD by decoding a write enable signal (/WE), a row address strobe signal (/RAS), a column address strobe signal (/CAS), a chip select signal (/CS), etc. The control logic 410 may further receive a clock signal (CLK) and a clock enable signal (/CKE) for operating the memory device 500 in a synchronous manner. In some embodiments, the control logic 410 may control the refresh address generator 480 such that the refresh address generator 480 generates a refresh row address REF_ADDR on which a refresh operation is performed. The control logic 410 may output an activated refresh signal REF while performing the refresh operation and output a deactivated refresh signal REF after finishing the refresh operation.

The address register 420 may receive the address signal ADDR including a bank address BANK_ADDR, an active row address ROW_ADDR and a column address COL_ADDR from the external memory controller (not shown). The address register 420 may provide the bank address BANK_ADDR to the bank control logic 430, provide the active row address ROW_ADDR to the row address buffer 421, and provide the column address COL_ADDR to the column address latch 450.

The row address buffer 421 may temporary store the active row address ROW_ADDR and provide the active row address ROW_ADDR to the refresh address generator 480 and to the row address multiplexer 440.

The refresh address generator 480 may generate the refresh row address REF_ADDR on which a refresh operation is performed based on the active row address ROW_ADDR under a control of the control logic 410.

The bank control logic 430 may generate bank control signals in response to the bank address BANK_ADDR. One of the first through fourth bank row decoders 460a, 460b, 460c and 460d corresponding to the bank address BANK_ADDR may be activated in response to the bank control signals, and one of the first through fourth bank column decoders 470a, 470b, 470c and 470d corresponding to the bank address BANK_ADDR may be activated in response to the bank control signals.

The row address multiplexer 440 may receive the active row address ROW_ADDR from the row address buffer 421 and receive the refresh row address REF_ADDR from the refresh address generator 480. The row address multiplexer 440 may output one of the active row address ROW_ADDR and the refresh row address REF_ADDR in response to the refresh signal REF received from the control logic 410. For example, the row address multiplexer 440 may output the refresh row address REF_ADDR when the refresh signal REF is activated, and output the active row address ROW_ADDR when the refresh signal REF is deactivated. A row address output from the row address multiplexer 440 may be applied to the first through fourth bank row decoders 460a, 460b, 460c and 460d.

The activated one of the first through fourth bank row decoders 460a, 460b, 460c and 460d may decode the row address received from the row address multiplexer 440 and activate a page coupled to a word line corresponding to the row address. For example, the activated bank row decoder may apply a word line driving voltage to the word line corresponding to the row address.

The column address latch 450 may receive the column address COL_ADDR from the address register 420 and temporarily store the received column address COL_ADDR. In some embodiments, in a burst mode, the column address latch 450 may generate column addresses that increment from the received column address COL_ADDR. The column address latch 450 may apply the temporarily stored or generated column address to the first through fourth bank column decoders 470a, 470b, 470c and 470d.

The activated one of the first through fourth bank column decoders 470a, 470b, 470c and 470d may decode the column address COL_ADDR received from the column address latch 450 and control the input/output gating circuit 490 to output data corresponding to the column address COL_ADDR.

The input/output gating circuit 490 may include a circuitry for gating input/output data. The input/output gating circuit 490 may further include an input data mask logic, read data latches for storing data received from the first through fourth bank arrays 300a, 300b, 300c and 300d, and write drivers for writing data to the first through fourth bank arrays 300a, 300b, 300c and 300d.

Data DT to be read from one bank array of the first through fourth bank arrays 300a, 300b, 300c and 300d may be sensed by a bank sense amplifier coupled to the one bank array and be stored in the read data latches. The data DT stored in the read data latches may be provided to the data input/output buffer 600. The data input/output buffer 600 may provide the data DT to the external memory controller. Data DT to be written to one bank array of the first through fourth bank arrays 300a, 300b, 300c and 300d may be provide from the external memory controller to the data input/output buffer 600. The data DT provided to the data input/output buffer 600 may be written to the one bank array via the write drivers.

As described above with reference to FIG. 2, the data input/output buffer 600 included in the master semiconductor die 100 may be coupled to the memory device 500 included in each of the plurality of slave semiconductor dies 200-1 and 200-2 through a TSV. Therefore, as illustrated in FIG. 3, the data DT read from the memory device 500 included in each of the plurality of slave semiconductor dies 200-1 and 200-2 may be provided to the data input/output buffer 600 included in the master semiconductor die 100 through the TSV, and the data DT to be written to the memory device 500 included in each of the plurality of slave semiconductor dies 200-1 and 200-2 may be provided from the data input/output buffer 600 included in the master semiconductor die 100 to the memory device 500 included in each of the plurality of slave semiconductor dies 200-1 and 200-2 through the TSV.

Figure 4:
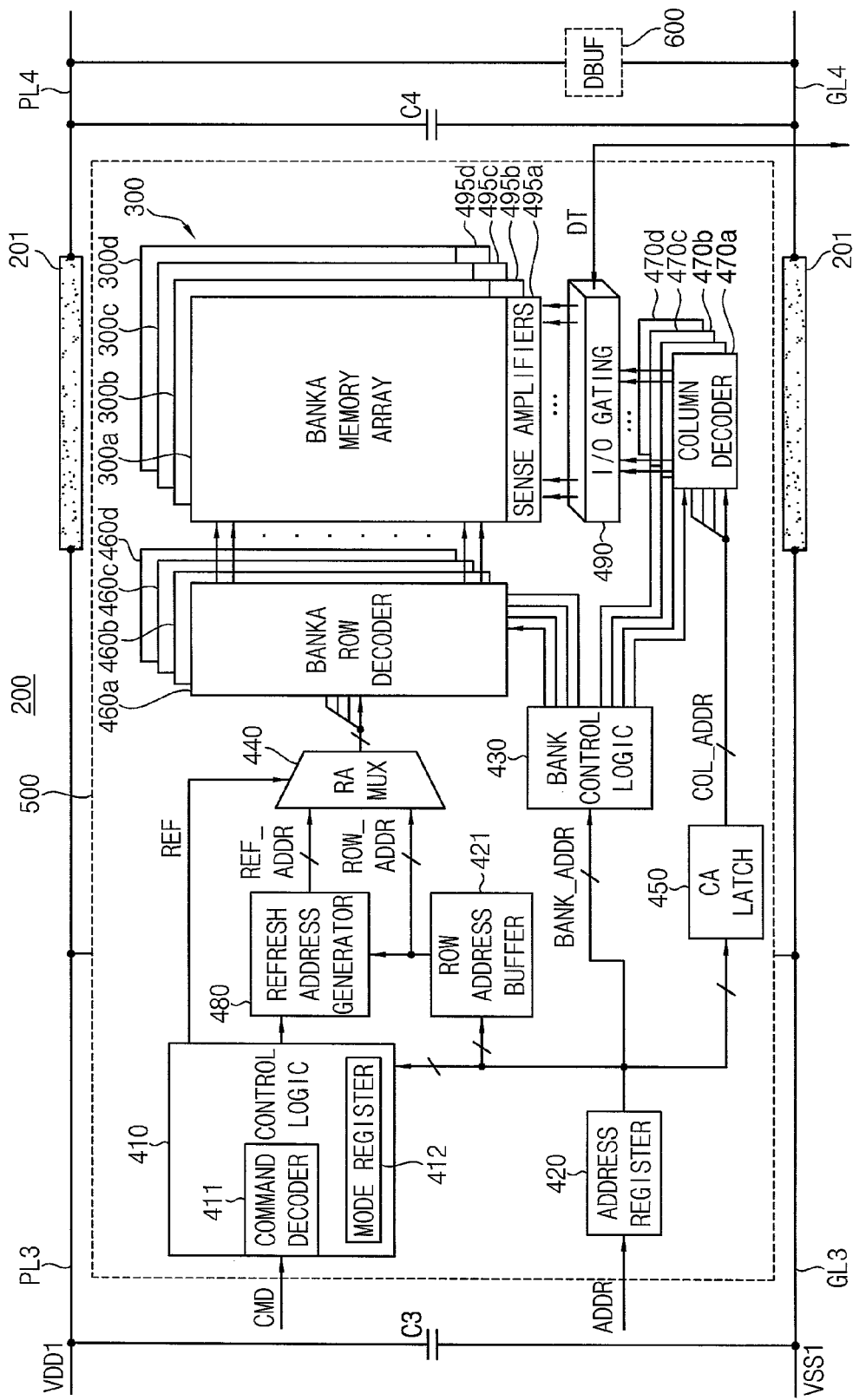
FIG. 4 is a block diagram illustrating an example embodiment of a slave semiconductor die included in the stacked memory device of FIG. 2.

FIG. 4 is a block diagram illustrating an example embodiment of a slave semiconductor die included in the stacked memory device of FIG. 2.

Each of the plurality of slave semiconductor dies 200-1 and 200-2 included in the stacked memory device 10 of FIG. 2 may be implemented with a slave semiconductor die 200 of FIG. 4.

Referring to FIG. 4, the slave semiconductor die 200 may include the memory device 500, the data input/output buffer 600, the third power capacitor C3, and the fourth power capacitor C4.

The memory device 500 and the third power capacitor C3 may be coupled between the third power line PL3 and the third ground line GL3, and the data input/output buffer 600 and the fourth power capacitor C4 may be coupled between the fourth power line PL4 and the fourth ground line GL4.

As described above with reference to FIG. 2, the first power supply voltage VDD1 may be provided to the third power line PL3, and the first ground voltage VSS1 may be provided to the third ground line GL3. Therefore, the memory device 500 may operate using the first power supply voltage VDD1.

In this exemplary embodiment, the third power line PL3 and the fourth power line PL4 may be electrically connected to each other by the connection structure 201, and the third ground line GL3 and the fourth ground line GL4 may be electrically connected to each other by the connection structure 201. Therefore, the third power capacitor C3 and the fourth power capacitor C4 may be coupled in parallel between the first power supply voltage VDD1 and the first ground voltage VSS1, such that a total capacitance coupled between the first power supply voltage VDD1 and the first ground voltage VSS1 may be increased. Therefore, a temporary decrease of a voltage of the third power line PL3 when the memory device 500 operates using charges provided from the third power line PL3 may be further suppressed.

The memory device 500 included in the slave semiconductor die 200 of FIG. 4 is the same as the memory device 500 included in the master semiconductor die 100 of FIG. 3. Therefore, duplicated description will be omitted.

The data input/output buffer 600 included in the slave semiconductor die 200 may be deactivated and may not be used. Therefore, data DT read from the memory device 500 included in the slave semiconductor die 200 may be stored in the read data latches included in the input/output gating circuit 490, the data DT stored in the read data latches may be provided to the data input/output buffer 600 included in the master semiconductor die 100 through the TSV, and the data input/output buffer 600 included in the master semiconductor die 100 may provide the data DT to the external memory controller. Data DT to be written to the memory device 500 included in the slave semiconductor die 200 may be provide from the external memory controller to the data input/output buffer 600 included in the master semiconductor die 100, and the data input/output buffer 600 included in the master semiconductor die 100 may provide the data DT to the write drivers of the input/output gating circuit 490 included in the slave semiconductor die 200 through the TSV. Therefore, the input/output gating circuit 490 included in the slave semiconductor die 200 may write the data DT, which is received from the data input/output buffer 600 included in the master semiconductor die 100, in the memory cell array 300.

Generally, as an operation speed of an electronic device increases, a speed of a data transfer between a memory device and a memory controller also increases. Therefore, if the memory device 500 and the data input/output buffer 600 operate using a same power supply voltage, a voltage level of the power supply voltage may falter due to a noise caused by a high speed data transfer between the data input/output buffer 600 and the external memory controller. As a result, an error may occur in an operation of the memory device 500.

However, as described above with reference to FIGS. 1 to 4, in the stacked memory device 10 according to example embodiments, the memory device 500, which includes the at least one memory cell array 300 and the peripheral circuit 400, may operate using the first power supply voltage VDD1, and the data input/output buffer 600 may operate using the second power supply voltage VDD2. Therefore, the stacked memory device 10 according to example embodiments may effectively prevent an operation error of the memory device 500 even if the memory device 500 is being operated in a high speed.

In addition, as described above, the data input/output buffer 600 included in each of the plurality of slave semiconductor dies 200-1 and 200-2 may be deactivated and may not be used. However, since the third power line PL3 and the fourth power line PL4 included in each of the plurality of slave semiconductor dies 200-1 and 200-2 are electrically connected to each other by the connection structure 201, and the third ground line GL3 and the fourth ground line GL4 included in each of the plurality of slave semiconductor dies 200-1 and 200-2 are electrically connected to each other by the connection structure 201, the stacked memory device 10 may operate correctly.

For example, since the third power line PL3 and the fourth power line PL4 included in each of the plurality of slave semiconductor dies 200-1 and 200-2 are electrically connected to each other, and the third ground line GL3 and the fourth ground line GL4 included in each of the plurality of slave semiconductor dies 200-1 and 200-2 are electrically connected to each other, the third power capacitor C3 and the fourth power capacitor C4 may be coupled in parallel between the first power supply voltage VDD1, which is applied to the third power line PL3 and the fourth power line PL4, and the first ground voltage VSS1, which is applied to the third ground line GL3 and the fourth ground line GL4. Therefore, a total capacitance coupled between the first power supply voltage VDD1 and the first ground voltage VSS1 in each of the plurality of slave semiconductor dies 200-1 and 200-2 may be increased. As such, a temporary decrease of a voltage of the third power line PL3 and the fourth power line PL4, when the memory device 500 included in each of the plurality of slave semiconductor dies 200-1 and 200-2 operates using charges provided from the third power line PL3 and the fourth power line PL4, may be effectively suppressed.

Figure 5:
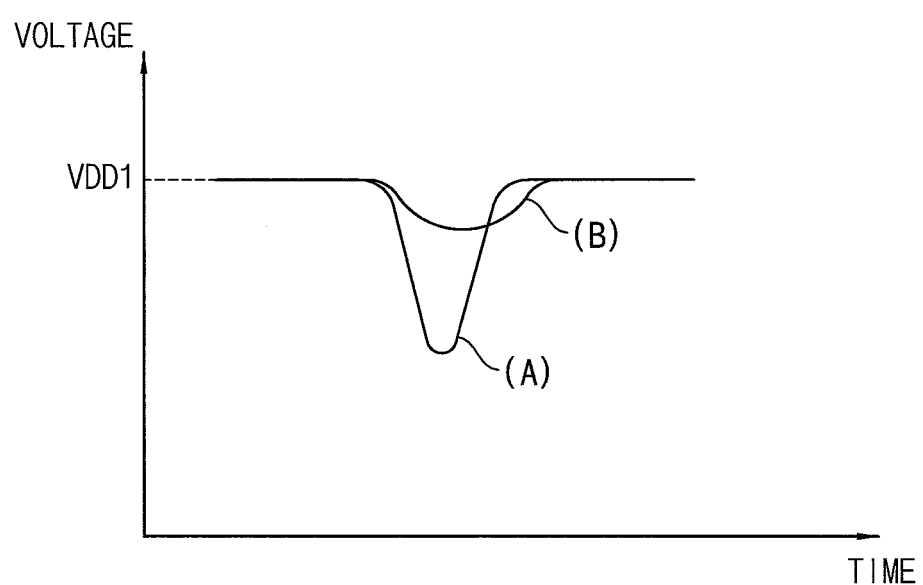
FIG. 5 is a diagram for describing a voltage change of a third power line in a slave semiconductor die included in the stacked memory device of FIG. 2 according to example embodiments.

FIG. 5 is a diagram for describing a voltage change of a third power line in a slave semiconductor die included in the stacked memory device of FIG. 2 according to example embodiments.

In FIG. 5, x-axis represents time, and y-axis represents a voltage of the third power line PL3 include in each of the plurality of slave semiconductor dies 200-1 and 200-2.

In FIG. 5, a first graph A represents a voltage of the third power line PL3 when the third power line PL3 and the fourth power line PL4 are electrically disconnected from each other and the third ground line GL3 and the fourth ground line GL4 are electrically disconnected from each other, and a second graph B represents a voltage of the third power line PL3 when the third power line PL3 and the fourth power line PL4 are electrically connected to each other through the connection structure 201 and the third ground line GL3 and the fourth ground line GL4 are electrically connected to each other through the connection structure 201.

Referring to FIG. 5, when the memory device 500 included in each of the plurality of slave semiconductor dies 200-1 and 200-2 is in an idle state, a voltage of the third power line PL3 may be maintained at the first power supply voltage VDD1. However, when the memory device 500 included in each of the plurality of slave semiconductor dies 200-1 and 200-2 operates using charges provided from the third power line PL3, the voltage of the third power line PL3 may be decreased temporarily.

As illustrated in the first graph A of FIG. 5, if the third power line PL3 and the fourth power line PL4 are electrically disconnected from each other and the third ground line GL3 and the fourth ground line GL4 are electrically disconnected from each other, the voltage of the third power line PL3 may decrease even further carrying voltage much lower than VDD1 since only the third power capacitor C3 is coupled between the third power line PL3 and the third ground line GL3. In this case, an operation error may occur in an operation of the memory device 500.

However, as illustrated in the second graph B of FIG. 5, if the third power line PL3 and the fourth power line PL4 are electrically connected to each other and the third ground line GL3 and the fourth ground line GL4 are electrically connected to each other, the voltage of the third power line PL3 may decrease a little since the third power capacitor C3 and the fourth power capacitor C4 are coupled in parallel between the third power line PL3 and the third ground line GL3.

Since the plurality of slave semiconductor dies 200-1 and 200-2 receive the first power supply voltage VDD1 through the TSV, a magnitude of the first power supply voltage VDD1 provided to the plurality of slave semiconductor dies 200-1 and 200-2 may be smaller than a magnitude of the first power supply voltage VDD1 provided to the master semiconductor die 100 due to a voltage drop by the TSV.

However, as described above, since the third power line PL3 and the fourth power line PL4 are electrically connected to each other and the third ground line GL3 and the fourth ground line GL4 are electrically connected to each other in each of the plurality of slave semiconductor dies 200-1 and 200-2, a temporary decrease of the voltage of the third power line PL3 when the memory device 500 operates using charges provided from the third power line PL3 may be effectively suppressed. Therefore, the stacked memory device 10 according to example embodiments may effectively prevent an operation error although operating in a high speed.

Referring to FIGS. 2-5, in some example embodiments, in the master semiconductor die 100, the memory device MEM 500, which is coupled between the first power line PL1 and the first ground line GL1, may be provided in parallel with a first charge storage unit, e.g., a first charge storage circuit, which may consist of or include a first power capacitor C1, which is also coupled between the first power line PL1 and the first ground line GL1, and the data input/output buffer 600, which is coupled between the second power line PL2 and the second ground line GL2, may be provided in parallel with a second charge storage unit, e.g., a second charge storage circuit, which may consist of or include or a second power capacitor C2, which is also coupled between the second power line PL2 and the second ground line GL2. In some example embodiments, in each of the plurality of slave semiconductor dies 200-1 and 200-2, the memory device MEM 500, which is coupled between the third power line PL3 and the third ground line GL3, may be provided in parallel with a third charge storage unit, e.g., a third charge storage circuit, which may consist of or include a third power capacitor C3, which is also coupled between the third power line PL3 and the third ground line GL3, and the data input/output buffer 600, which is coupled between the fourth power line PL4 and the fourth ground line GL4, may be provided in parallel with a fourth charge storage unit, e.g., a fourth charge storage circuit, which may consist of or include a fourth power capacitor C4, which is also coupled between the fourth power line PL4 and the fourth ground line GL4. In some example embodiments, in each of the plurality of slave semiconductor dies 200-1 and 200-2, the memory device MEM 500, which is coupled between the third power line PL3 and the third ground line GL3, may be provided in parallel with both the third charge storage unit (e.g., the third capacitor C3) and the fourth charge storage unit (e.g., the fourth power capacitor C4) and the data input/output buffer 600, which is coupled between the fourth power line PL4 and the fourth ground line GL4, may be provided in parallel with both the third charge storage unit (e.g., the third capacitor C3) and the fourth charge storage unit (e.g., the fourth power capacitor C4).

In some example embodiments, referring to FIG. 5, as described above, when the memory device 500 included in each of the plurality of slave semiconductor dies 200-1 and 200-2 is in an idle state, a voltage of the third power line PL3 may be maintained at the first power supply voltage VDD1. However, when the third power line PL3 and the fourth power line PL4 are electrically disconnected from each other and the third ground line GL3 and the fourth ground line GL4 are electrically disconnected from each other and when the memory device 500 included in each of the plurality of slave semiconductor dies 200-1 and 200-2 operates using charges provided from the third power line PL3, the voltage (e.g., power) of the third power line PL3 may be decreased temporarily (e.g., the voltage of the third power line PL3 may fall below the first power supply voltage VDD1). To compensate for this power drop in the third power line PL3, the third charge storage unit (e.g., the third capacitor C3) may provide additional charges to the third power line PL3. Therefore, since the memory device MEM 500 included in each of the plurality of slave semiconductor dies 200-1 and 200-2 is provided in parallel with the third charge storage unit, the memory device MEM 500 may still be operated by using charges from the third power line PL3 which receives additional charges from the third charge storage unit.

In some example embodiments, as illustrated in the second graph B of FIG. 5, if the third power line PL3 and the fourth power line PL4 are electrically connected to each other and the third ground line GL3 and the fourth ground line GL4 are electrically connected to each other, the voltage of the third power line PL3 may not decrease as much as it decreases when the third power line PL3 and the fourth power line PL4 are electrically disconnected from each other since the third power capacitor C3 and the fourth power capacitor C4 are coupled in parallel between the third power line PL3 and the third ground line GL3. Therefore, since the memory device MEM 500 included in each of the plurality of slave semiconductor dies 200-1 and 200-2 is provided in parallel with both the third charge storage unit (e.g., the third power capacitor C3) and the fourth charge storage unit (e.g., the fourth power capacitor C4), the memory device MEM 500 may be operated by using charges from the third power line PL3 which receives additional charges from the third charge storage unit and from the fourth power line PL4 which receives additional charges from the fourth charge storage unit. Therefore, a temporary decrease of the voltage of the third power line PL3 when the memory device 500 operates using charges provided from the third power line PL3 may be effectively suppressed.

Figure 6:
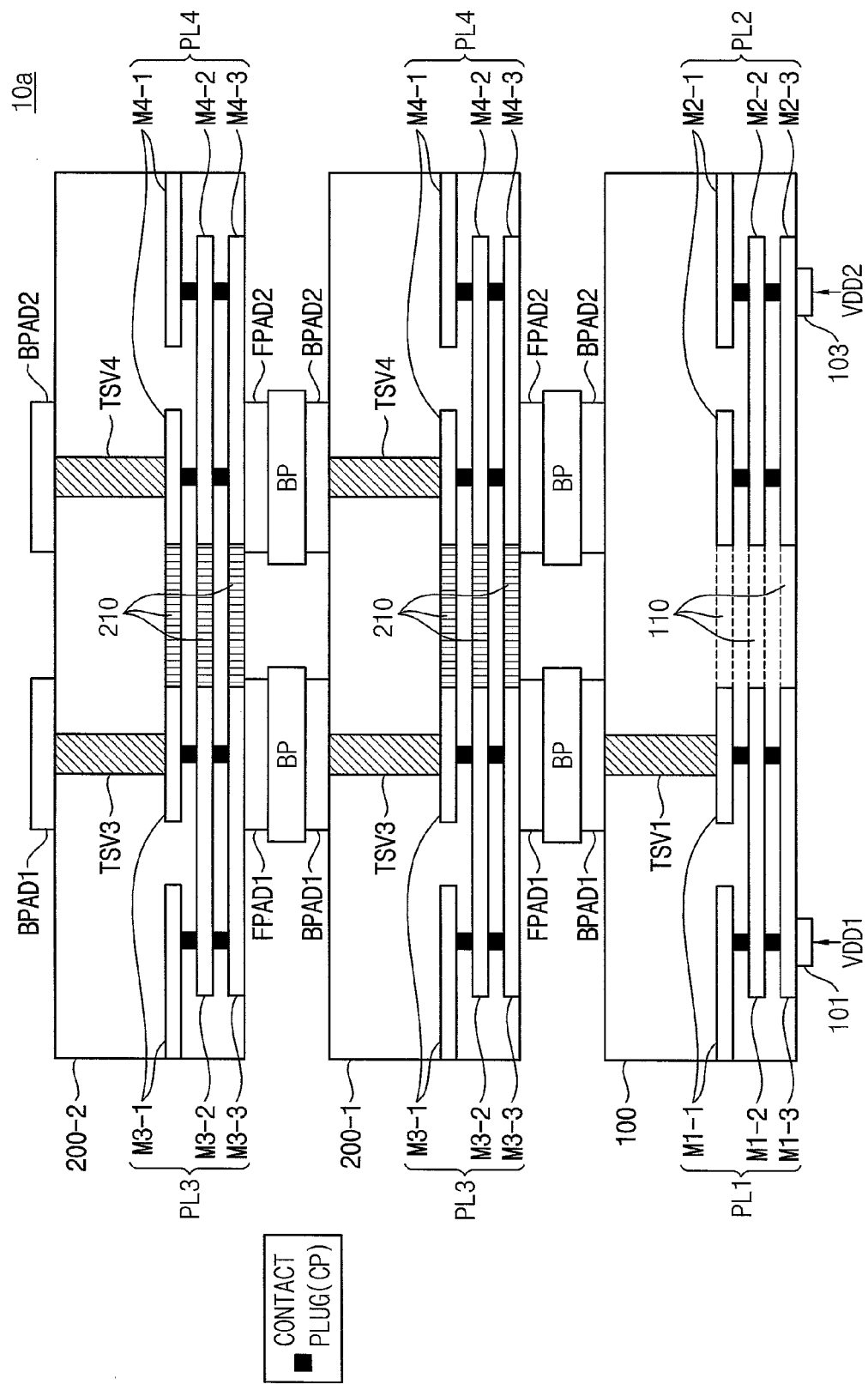
FIG. 6 is a diagram illustrating an example embodiment of the stacked memory device of FIG. 2.

FIG. 6 is a diagram illustrating an example of the stacked memory device of FIG. 2 according to example embodiments.

In FIG. 6, an example embodiment of a cross sectional view of the stacked memory device 10 of FIG. 2 is illustrated.

For ease of explanation, only elements related with the first power line PL1, the second power line PL2, the third power line PL3, and the fourth power line PL4 are illustrated in FIG. 6.

In this exemplary embodiment, referring to FIG. 6, a stacked memory device 10a includes a master semiconductor die 100 and a plurality of slave semiconductor dies 200-1 and 200-2 stacked on the master semiconductor die 100.

The master semiconductor die 100 may include a first back surface pad BPAD1 and a second back surface pad BPAD2 formed on a back surface.

Each of plurality of slave semiconductor dies 200-1 and 200-2 may include a first front surface pad FPAD1 and a second front surface pad FPAD2 formed on a front surface and a first back surface pad BPAD1 and a second back surface pad BPAD2 formed on a back surface.

The master semiconductor die 100 and the plurality of slave semiconductor dies 200-1 and 200-2 are stacked in a perpendicular direction by bonding the first back surface pad BPAD1 and the second back surface pad BPAD2 of a lower semiconductor die to the first front surface pad FPAD1 and the second front surface pad FPAD2 of an upper semiconductor die, respectively, through a bump BP.

In addition, the master semiconductor die 100 may include the first external pad 101 and the third external pad 103 formed on a front surface. The master semiconductor die 100 may receive the first power supply voltage VDD1 and the second power supply voltage VDD2 through the first external pad 101 and the third external pad 103, respectively.

The master semiconductor die 100 may include the first power line PL1, which includes a plurality of wiring patterns M1-1, M1-2, and M1-3 formed on a plurality of layers, and the second power line PL2, which includes a plurality of wiring patterns M2-1, M2-2, and M2-3 formed on a plurality of layers. Each of the plurality of slave semiconductor dies 200-1 and 200-2 may include the third power line PL3, which includes a plurality of wiring patterns M3-1, M3-2, and M3-3 formed on a plurality of layers, and the fourth power line PL4, which includes a plurality of wiring patterns M4-1, M4-2, and M4-3 formed on a plurality of layers.

In this exemplary embodiment, the plurality of wiring patterns M1-1, M1-2, and M1-3 included in the first power line PL1 are electrically connected to each other by contact plugs CP, the plurality of wiring patterns M2-1, M2-2, and M2-3 included in the second power line PL2 are electrically connected to each other by contact plugs CP, the plurality of wiring patterns M3-1, M3-2, and M3-3 included in the third power line PL3 are electrically connected to each other by contact plugs CP, and the plurality of wiring patterns M4-1, M4-2, and M4-3 included in the fourth power line PL4 are electrically connected to each other by contact plugs CP. Contact plugs CP may be, for example, conductive plugs formed of a conductive material such as a metal. The wiring patterns described above may also be formed of a conductive material, for example, a metal, and each may be formed horizontally within the die.

In the master semiconductor die 100, the first power line PL1 is coupled to the first power supply voltage VDD1, and the second power line PL2 is coupled to the second power supply voltage VDD2.

As illustrated in FIG. 6, the first power line PL1 included in the master semiconductor die 100 is electrically connected to the third power line PL3 included in the slave semiconductor die 200-1, which is stacked on the master semiconductor die 100, through a first TSV TSV1, the first back surface pad BPAD1, the bump BP, and the first front surface pad FPAD1 of the slave semiconductor die 200-1. In addition, the third power line PL3 included in the slave semiconductor die 200-1 are electrically connected to the third power line PL3 included in the slave semiconductor die 200-2, which is stacked on the slave semiconductor die 200-1, through a third TSV TSV3, the first back surface pad BPAD1, the bump BP, and the first front surface pad FPAD1 of the slave semiconductor die 200-2.

As illustrated in FIG. 6, in some example embodiments, a TSV connecting the second power line PL2 included in the master semiconductor die 100 and the fourth power line PL4 included in the slave semiconductor die 200-1, which is stacked on the master semiconductor die 100, is not formed. Therefore, the second power line PL2 included in the master semiconductor die 100 is electrically disconnected from the fourth power line PL4 included in each of the plurality of slave semiconductor dies 200-1 and 200-2.

In some example embodiments, the fourth power line PL4 included in the slave semiconductor die 200-1 is electrically connected from the fourth power line PL4 included in the slave semiconductor die 200-2, which is stacked on the slave semiconductor die 200-1, through a fourth TSV TSV4, the second back surface pad BPAD2, the bump BP, and the second front surface pad FPAD2 of the slave semiconductor die 200-2.

As illustrated in FIG. 6, the first power line PL1 and the second power line PL2 included in the master semiconductor die 100 is detached from each other by a metal option 110 formed in an open state, and the third power line PL3 and the fourth power line PL4 included in each of the plurality of slave semiconductor dies 200-1 and 200-2 is coupled to each other by a metal option 210 formed in a closed state. For example, in a manufacturing process of the stacked memory device 10a, the metal option 110 may be formed using a metal mask detaching the first power line PL1 and the second power line PL2 on the master semiconductor die 100, and the metal option 210 may be formed using a metal mask coupling the third power line PL3 and the fourth power line PL4 on each of the plurality of slave semiconductor dies 200-1 and 200-2.

Therefore, in the case of the stacked memory device 10a of FIG. 6, the third power line PL3 and the fourth power line PL4 included in each of the plurality of slave semiconductor dies 200-1 and 200-2 are electrically connected to each other inside each of the plurality of slave semiconductor dies 200-1 and 200-2.

The metal option 210 formed between the third power line PL3 and the fourth power line PL4 in the stacked memory device 10a of FIG. 6 corresponds to an example of the connection structure 201 electrically connecting the third power line PL3 and the fourth power line PL4 in the stacked memory device 10 of FIG. 2.

Hereinabove, an example of a method of electrically disconnecting the first power line PL1 from the second power line PL2 included in the master semiconductor die 100, and electrically connecting the third power line PL3 and the fourth power line PL4 included in each of the plurality of slave semiconductor dies 200-1 and 200-2 is described with reference to FIG. 6. Similarly, the first ground line GL1 and the second ground line GL2 included in the master semiconductor die 100 are electrically disconnected from each other, and the third ground line GL3 and the fourth ground line GL4 included in each of the plurality of slave semiconductor dies 200-1 and 200-2 are electrically connected to each other by the same method described above with reference to FIG. 6.

Figure 7:
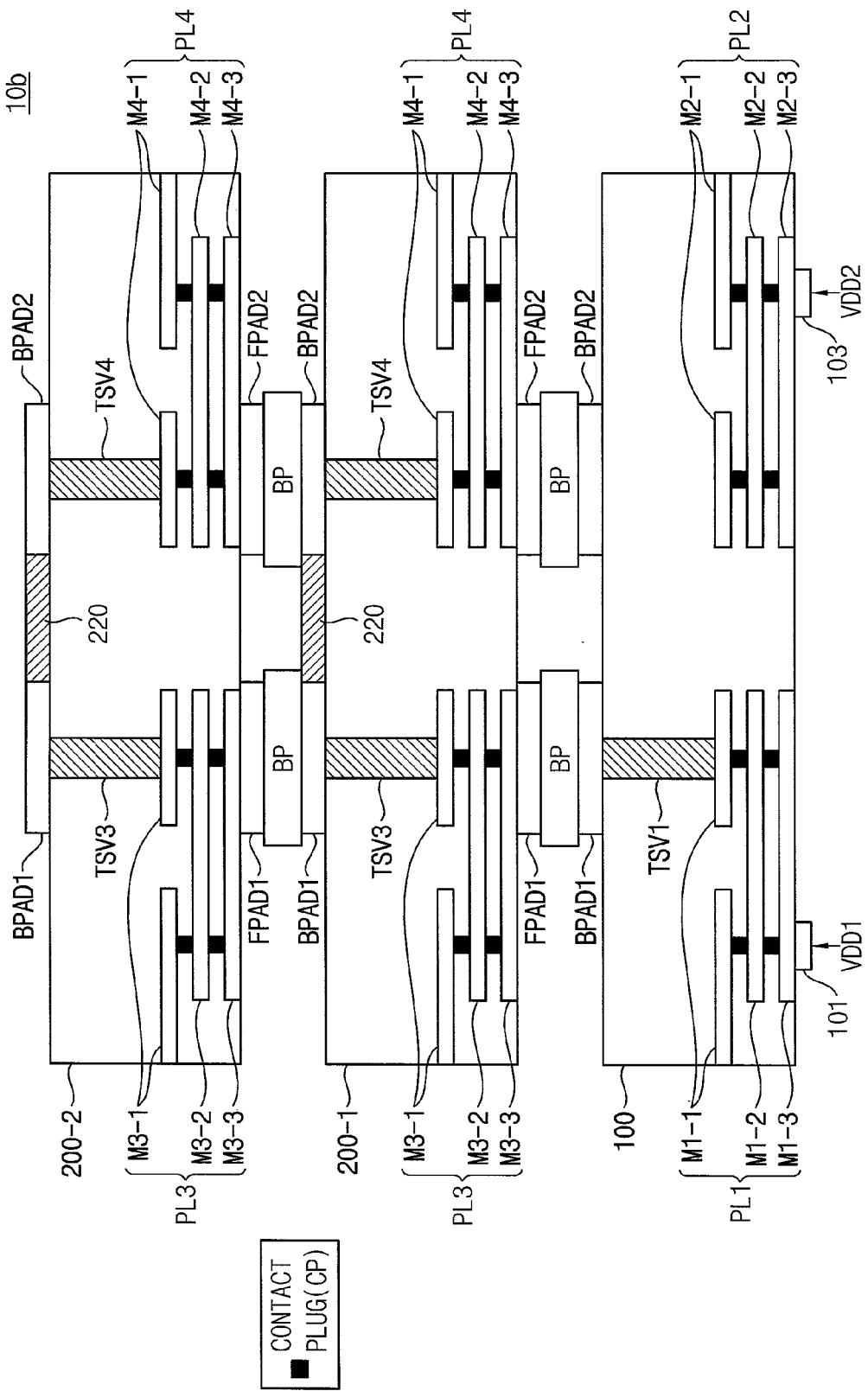
FIG. 7 is a diagram illustrating an example embodiment of the stacked memory device of FIG. 2.

FIG. 7 is a diagram illustrating an example embodiment of the stacked memory device of FIG. 2.

In FIG. 7, an example of a cross sectional view of the stacked memory device 10 of FIG. 2 is illustrated.

For ease of explanation, only elements related with the first power line PL1, the second power line PL2, the third power line PL3, and the fourth power line PL4 are illustrated in FIG. 7.

In this exemplary embodiment, referring to FIG. 7, a stacked memory device 10b includes a master semiconductor die 100 and a plurality of slave semiconductor dies 200-1 and 200-2 stacked on the master semiconductor die 100.

The stacked memory device 10b of FIG. 7 is the same as the stacked memory device 10a of FIG. 6 except that the stacked memory device 10b of FIG. 7 includes a connection pad 220 instead of the metal option 110 and the metal option 210. Therefore, duplicated description will be omitted, and only a structure related with the connection pad 220 will be described below.

Figure 8:
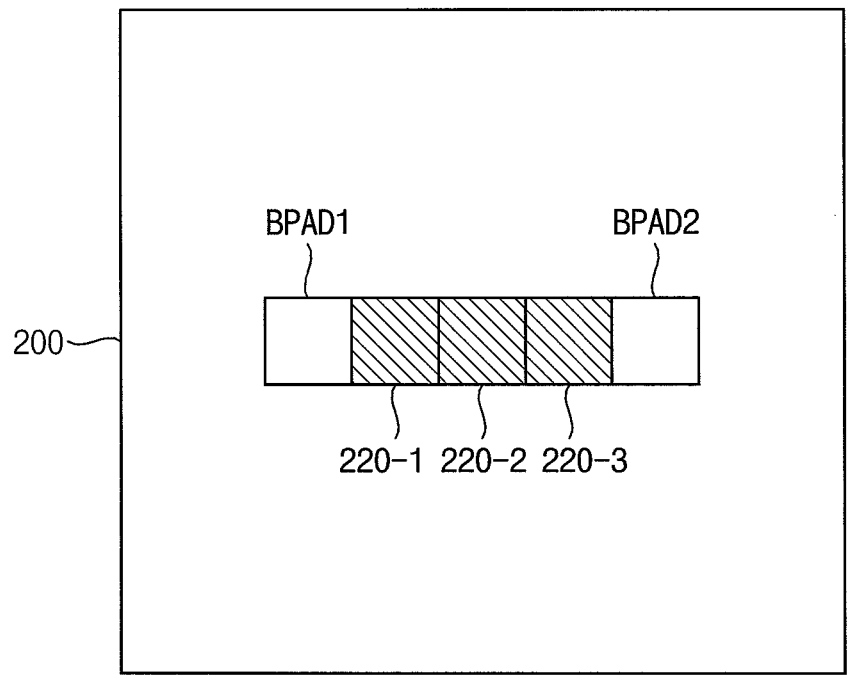
FIG. 8 is a diagram illustrating a plane view of a back surface of a slave semiconductor die included in the stacked memory device of FIG. 7 according to example embodiments.

FIG. 8 is a diagram illustrating a plane view of a back surface of a slave semiconductor die included in the stacked memory device of FIG. 7 according to example embodiments.

Referring to FIGS. 7 and 8, each of the plurality of slave semiconductor dies 200-1 and 200-2 may include at least one connection pad 220 formed between the first back surface pad BPAD1 and the second back surface pad BPAD2 on the back surface of each of the plurality of slave semiconductor dies 200-1 and 200-2. If the at least one connection pad 220 includes a plurality of pads, the pads may contact each other.

FIG. 8 illustrates that three connection pads 220-1, 220-2, and 220-3 are formed between the first back surface pad BPAD1 and the second back surface pad BPAD2 on the back surface of the slave semiconductor die 200 as an example. In some example, the number of connection pads may be more than three or less than three.

In some example embodiments, the at least one connection pad 220 may be formed by a same process as a process used to form the first back surface pad BPAD1 and the second back surface pad BPAD2. For example, the at least one connection pad 220 may be formed by repeatedly performing the same process used to form the first back surface pad BPAD1 and the second back surface pad BPAD2.

Therefore, the first back surface pad BPAD1 and the second back surface pad BPAD2 formed on the back surface of each of the plurality of slave semiconductor dies 200-1 and 200-2 are electrically connected to each other by the at least one connection pad 220 formed on the back surface.

As described above with reference to FIG. 6, the first back surface pad BPAD1 formed on each of the plurality of slave semiconductor dies 200-1 and 200-2 is coupled to the third power line PL3 through the third TSV TSV3, and the second back surface pad BPAD2 formed on each of the plurality of slave semiconductor dies 200-1 and 200-2 is coupled to the fourth power line PL4 through the fourth TSV TSV4. Therefore, the third power line PL3 and the fourth power line PL4 included in each of the plurality of slave semiconductor dies 200-1 and 200-2 are electrically connected to each other by the at least one connection pad 220.

The at least one connection pad 220 formed between the first back surface pad BPAD1 and the second back surface pad BPAD2 on the back surface of each of the plurality of slave semiconductor dies 200-1 and 200-2 in the stacked memory device 10b of FIG. 7 corresponds to an example of the connection structure 201 electrically connecting the third power line PL3 and the fourth power line PL4 in the stacked memory device 10 of FIG. 2.

Since a connection pad is not formed between the first back surface pad BPAD1 and the second back surface pad BPAD2 on the back surface of the master semiconductor die 100, and a TSV connecting the second power line PL2 included in the master semiconductor die 100 and the fourth power line PL4 included in the slave semiconductor die 200-1, which is stacked on the master semiconductor die 100, is not formed, the first power line PL1 and the second power line PL2 included in the master semiconductor die 100 are electrically disconnected from each other.

Hereinabove, an example of a method of electrically disconnecting the first power line PL1 from the second power line PL2 included in the master semiconductor die 100, and electrically connecting the third power line PL3 and the fourth power line PL4 included in each of the plurality of slave semiconductor dies 200-1 and 200-2 is described with reference to FIG. 7. Similarly, the first ground line GL1 and the second ground line GL2 included in the master semiconductor die 100 are electrically disconnected from each other, and the third ground line GL3 and the fourth ground line GL4 included in each of the plurality of slave semiconductor dies 200-1 and 200-2 are electrically connected to each other by the same method described above with reference to FIG. 7.

Figure 9:
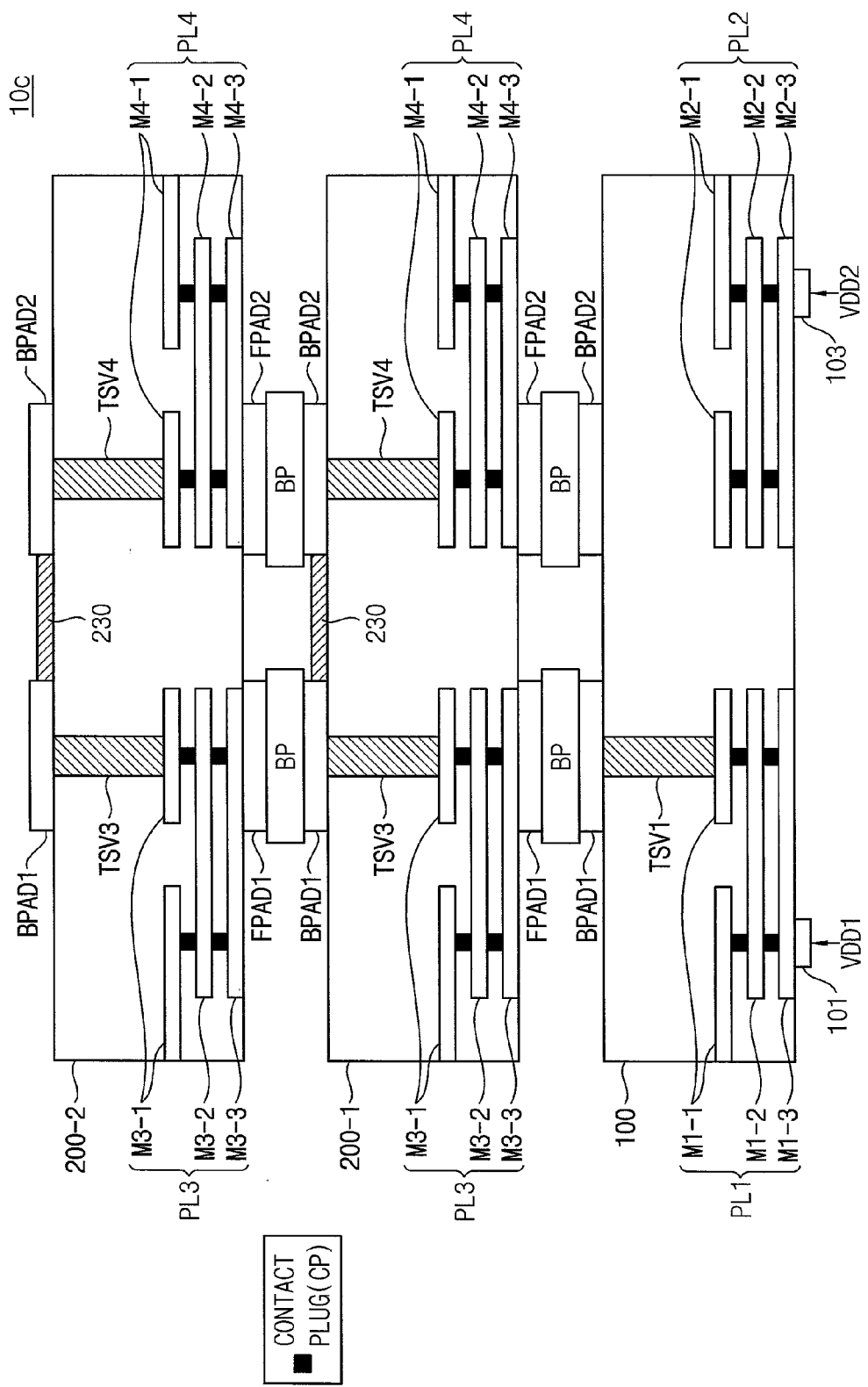
FIG. 9 is a diagram illustrating an example embodiment of the stacked memory device of FIG. 2.

FIG. 9 is a diagram illustrating an example embodiment of the stacked memory device of FIG. 2.

In FIG. 9, an example of a cross sectional view of the stacked memory device 10 of FIG. 2 is illustrated.

For ease of explanation, only elements related with the first power line PL1, the second power line PL2, the third power line PL3, and the fourth power line PL4 are illustrated in FIG. 9.

Referring to FIG. 9, a stacked memory device 10c includes a master semiconductor die 100 and a plurality of slave semiconductor dies 200-1 and 200-2 stacked on the master semiconductor die 100.

The stacked memory device 10c of FIG. 9 is the same as the stacked memory device 10a of FIG. 6 except that the stacked memory device 10c of FIG. 9 includes a connection wire 230 instead of the metal option 110 and the metal option 210. Therefore, duplicated description will be omitted, and only a structure related with the connection wire 230 will be described below.

Figure 10:
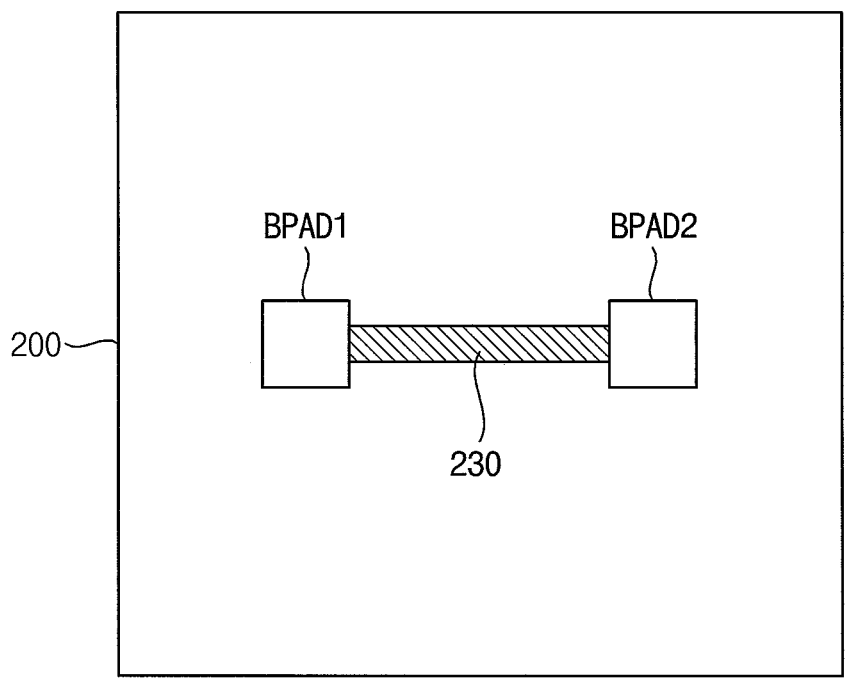
FIG. 10 is a diagram illustrating a plane view of a back surface of a slave semiconductor die included in the stacked memory device of FIG. 9 according to example embodiments.

FIG. 10 is a diagram illustrating a plane view of a back surface of a slave semiconductor die included in the stacked memory device of FIG. 9 according to example embodiments.

Referring to FIGS. 9 and 10, each of the plurality of slave semiconductor dies 200-1 and 200-2 includes a connection wire 230 connecting the first back surface pad BPAD1 and the second back surface pad BPAD2 on the back surface of each of the plurality of slave semiconductor dies 200-1 and 200-2.

In some example embodiments, after the first back surface pad BPAD1 and the second back surface pad BPAD2 are formed on the back surface of each of the plurality of slave semiconductor dies 200-1 and 200-2, the connection wire 230 is formed by additionally performing a wiring process between the first back surface pad BPAD1 and the second back surface pad BPAD2.

Therefore, the first back surface pad BPAD1 and the second back surface pad BPAD2 formed on the back surface of each of the plurality of slave semiconductor dies 200-1 and 200-2 are electrically connected to each other by the connection wire 230 formed on the back surface.

As described above with reference to FIG. 6, the first back surface pad BPAD1 formed on each of the plurality of slave semiconductor dies 200-1 and 200-2 is coupled to the third power line PL3 through the third TSV TSV3, and the second back surface pad BPAD2 formed on each of the plurality of slave semiconductor dies 200-1 and 200-2 is coupled to the fourth power line PL4 through the fourth TSV TSV4. Therefore, the third power line PL3 and the fourth power line PL4 included in each of the plurality of slave semiconductor dies 200-1 and 200-2 are electrically connected to each other by the connection wire 230.

The connection wire 230 formed between the first back surface pad BPAD1 and the second back surface pad BPAD2 on the back surface of each of the plurality of slave semiconductor dies 200-1 and 200-2 in the stacked memory device 10c of FIG. 9 corresponds to an example of the connection structure 201 electrically connecting the third power line PL3 and the fourth power line PL4 in the stacked memory device 10 of FIG. 2.

Since a connection wire is not formed between the first back surface pad BPAD1 and the second back surface pad BPAD2 on the back surface of the master semiconductor die 100, and a TSV connecting the second power line PL2 included in the master semiconductor die 100 and the fourth power line PL4 included in the slave semiconductor die 200-1, which is stacked on the master semiconductor die 100, is not formed, the first power line PL1 and the second power line PL2 included in the master semiconductor die 100 are electrically disconnected from each other.

Hereinabove, an example of a method of electrically disconnecting the first power line PL1 from the second power line PL2 included in the master semiconductor die 100, and electrically connecting the third power line PL3 and the fourth power line PL4 included in each of the plurality of slave semiconductor dies 200-1 and 200-2 is described with reference to FIG. 9. Similarly, the first ground line GL1 and the second ground line GL2 included in the master semiconductor die 100 are electrically disconnected from each other, and the third ground line GL3 and the fourth ground line GL4 included in each of the plurality of slave semiconductor dies 200-1 and 200-2 are electrically connected to each other by the same method described above with reference to FIG. 9.

Figure 11:
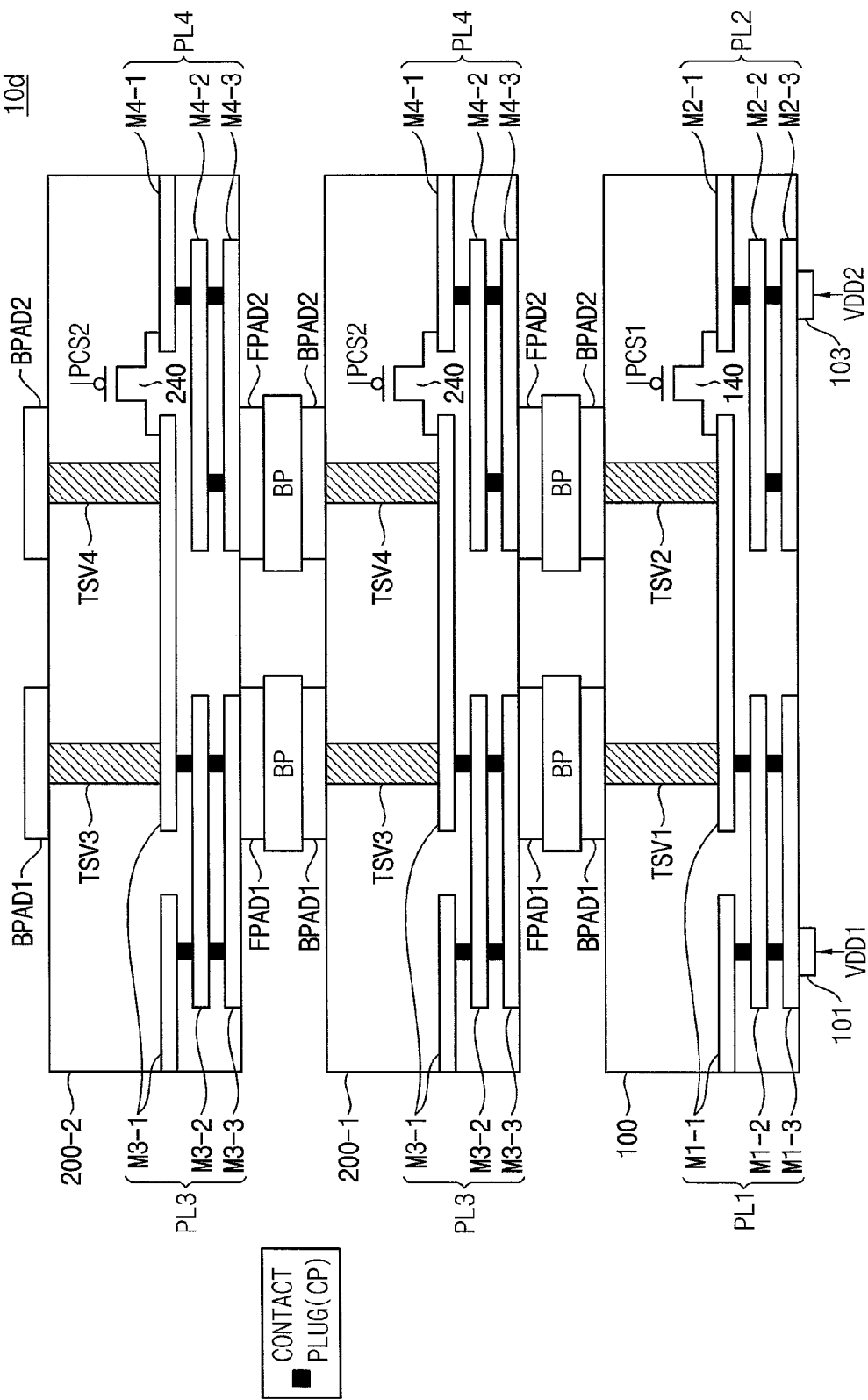
FIG. 11 is a diagram illustrating an example embodiment of the stacked memory device of FIG. 2.

FIG. 11 is a diagram illustrating an example embodiment of the stacked memory device of FIG. 2.

In FIG. 11, an example of a cross sectional view of the stacked memory device 10 of FIG. 2 is illustrated.

For ease of explanation, only elements related with the first power line PL1, the second power line PL2, the third power line PL3, and the fourth power line PL4 are illustrated in FIG. 11.

Referring to FIG. 11, a stacked memory device 10d may include a master semiconductor die 100 and a plurality of slave semiconductor dies 200-1 and 200-2 stacked on the master semiconductor die 100.

The master semiconductor die 100 may include a first back surface pad BPAD1 and a second back surface pad BPAD2 formed on a back surface.

Each of plurality of slave semiconductor dies 200-1 and 200-2 may include a first front surface pad FPAD1 and a second front surface pad FPAD2 formed on a front surface and a first back surface pad BPAD1 and a second back surface pad BPAD2 formed on a back surface.

The master semiconductor die 100 and the plurality of slave semiconductor dies 200-1 and 200-2 are stacked in a perpendicular direction by bonding the first back surface pad BPAD1 and the second back surface pad BPAD2 of a lower semiconductor die to the first front surface pad FPAD1 and the second front surface pad FPAD2 of an upper semiconductor die, respectively, through a bump BP.

In addition, the master semiconductor die 100 may include the first external pad 101 and the third external pad 103 formed on a front surface. The master semiconductor die 100 receives the first power supply voltage VDD1 and the second power supply voltage VDD2 through the first external pad 101 and the third external pad 103, respectively.

The master semiconductor die 100 includes the first power line PL1, which includes a plurality of wiring patterns M1-1, M1-2, and M1-3 formed on a plurality of layers, and the second power line PL2, which includes a plurality of wiring patterns M2-1, M2-2, and M2-3 formed on a plurality of layers. Each of the plurality of slave semiconductor dies 200-1 and 200-2 includes the third power line PL3, which includes a plurality of wiring patterns M3-1, M3-2, and M3-3 formed on a plurality of layers, and the fourth power line PL4, which includes a plurality of wiring patterns M4-1, M4-2, and M4-3 formed on a plurality of layers.

The plurality of wiring patterns M1-1, M1-2, and M1-3 included in the first power line PL1 are electrically connected to each other by contact plugs CP, the plurality of wiring patterns M2-1, M2-2, and M2-3 included in the second power line PL2 are electrically connected to each other by contact plugs CP, the plurality of wiring patterns M3-1, M3-2, and M3-3 included in the third power line PL3 are electrically connected to each other by contact plugs CP, and the plurality of wiring patterns M4-1, M4-2, and M4-3 included in the fourth power line PL4 are electrically connected to each other by contact plugs CP.

In the master semiconductor die 100, the first power line PL1 is coupled to the first power supply voltage VDD1, and the second power line PL2 is coupled to the second power supply voltage VDD2.

As illustrated in FIG. 11, the first power line PL1 included in the master semiconductor die 100 is electrically connected to the third power line PL3 included in the slave semiconductor die 200-1, which is stacked on the master semiconductor die 100, through a first TSV TSV1, the first back surface pad BPAD1, the bump BP, and the first front surface pad FPAD1 of the slave semiconductor die 200-1. In addition, the first power line PL1 included in the master semiconductor die 100 is electrically connected to the fourth power line PL4 included in the slave semiconductor die 200-1, which is stacked on the master semiconductor die 100, through a second TSV TSV2, the second back surface pad BPAD2, the bump BP, and the second front surface pad FPAD2 of the slave semiconductor die 200-1.

The third power line PL3 included in the slave semiconductor die 200-1 is electrically connected to the third power line PL3 included in the slave semiconductor die 200-2, which is stacked on the slave semiconductor die 200-1, through a third TSV TSV3, the first back surface pad BPAD1, the bump BP, and the first front surface pad FPAD1 of the slave semiconductor die 200-2. In addition, the third power line PL3 included in the slave semiconductor die 200-1 is electrically connected to the fourth power line PL4 included in the slave semiconductor die 200-2, which is stacked on the slave semiconductor die 200-1, through a fourth TSV TSV4, the second back surface pad BPAD2, the bump BP, and the second front surface pad FPAD2 of the slave semiconductor die 200-2.

In this exemplary embodiment, at least a portion of the second power line PL2 included in the master semiconductor die 100 may be located perpendicularly below the second TSV TSV2 and the first power line PL1, and the at least a portion of the second power line PL2 is not coupled to the first power line PL1 in a perpendicular direction. For example, in some embodiments, a portion of each of the wiring patterns M2-2 and M2-3 of the second power line PL2 is located perpendicularly below the second TSV TSV2 and is perpendicularly below a portion of the wiring pattern M1-1 of the first power line PL1 that is directly in contact with the second TSV TSV2. In some embodiments, a contact plug CP is not provided between a portion of the wiring pattern M2-2 of the second power line PL2 and a portion of the wiring pattern M1-1 of the first power line PL1 that contacts the second TSV TSV2. In addition, at least a portion of the fourth power line PL4 included in each of the plurality of slave semiconductor dies 200-1 and 200-2 is located perpendicularly below the fourth TSV TSV4 and the third power line PL3, and the at least a portion of the fourth power line PL4 is not coupled to the third power line PL3 in a perpendicular direction. For example, in some embodiments, a portion of each of the wiring patterns M4-2 and M4-3 of the fourth power line PL4 is located perpendicularly below the fourth TSV TSV4 and is located perpendicularly below a portion of the wiring pattern M3-1 of the third power line PL3 that is directly in contact with the fourth TSV TSV4. In some embodiments, a contact plug CP is not provided between a portion of the wiring pattern M4-2 of the fourth power line PL4 and a portion of the wiring pattern M3-1 of the third power line PL3 that contacts the fourth TSV TSV4.

In some embodiments the master semiconductor die 100 includes a first power switch 140 coupled between the first power line PL1 and the second power line PL2. For example, the first power switch 140 is coupled between a wiring pattern M1-1 of the first power line PL1 and a wiring pattern M2-1 of the second power line PL2, which are formed on a same layer. In some example embodiments, the first power switch 140 includes a p-type metal oxide semiconductor (PMOS) transistor. The first power switch 140 is maintained in a turned off state in response to a first power control signal PCS1 having a logic high level. Therefore, the first power line PL1 and the second power line PL2 included in the master semiconductor die 100 is electrically disconnected from each other.

In some embodiments, each of the plurality of slave semiconductor dies 200-1 and 200-2 further includes a second power switch 240 coupled between the third power line PL3 and the fourth power line PL4. For example, the second power switch 240 is coupled between a wiring pattern M3-1 of the third power line PL3 and a wiring pattern M4-1 of the fourth power line PL4, which are formed on a same layer. In some example embodiments, the second power switch 240 may include a PMOS transistor. The second power switch 240 is maintained in a turned on state in response to a second power control signal PCS2 having a logic low level. Therefore, the third power line PL3 and the fourth power line PL4 included in each of plurality of slave semiconductor dies 200-1 and 200-2 are electrically connected to each other.

The second power switch 240, which is coupled between the third power line PL3 and the fourth power line PL4 and is maintained in a turned on state, in the stacked memory device 10d of FIG. 11 corresponds to an example of the connection structure 201 electrically connecting the third power line PL3 and the fourth power line PL4 in the stacked memory device 10 of FIG. 2.

Hereinabove, an example of a method of electrically disconnecting the first power line PL1 from the second power line PL2 included in the master semiconductor die 100, and electrically connecting the third power line PL3 and the fourth power line PL4 included in each of the plurality of slave semiconductor dies 200-1 and 200-2 is described with reference to FIG. 11. Similarly, the first ground line GL1 and the second ground line GL2 included in the master semiconductor die 100 are electrically disconnected from each other, and the third ground line GL3 and the fourth ground line GL4 included in each of the plurality of slave semiconductor dies 200-1 and 200-2 are electrically connected to each other by the same method described above with reference to FIG. 11.

FIG. 12 is a block diagram illustrating a memory system according to example embodiments.

Referring to FIG. 12, a memory system 700 includes a stacked memory device 10 and a memory controller 20.

In this exemplary embodiment, the stacked memory device 10 includes a master semiconductor die MD 100 and a plurality of slave semiconductor dies SD1~SDn 200-1~200-n stacked on the master semiconductor die 100. Here, n represents a positive integer.

The master semiconductor die 100 and the plurality of slave semiconductor dies 200-1~200-n are electrically connected to each other by TSVs to communicate with each other through the TSVs.

The master semiconductor die 100 and each of the plurality of slave semiconductor dies 200-1~200-n includes a memory device having a same structure.

The memory controller 20 may provide a command signal CMD and an address signal ADDR to the stacked memory device 10 to write data DT in the stacked memory device 10 or to read data DT from the stacked memory device 10.

A communication of the command signal CMD, the address signal ADDR, and the data DT between the memory controller 20 and the stacked memory device 10 may be performed through the master semiconductor die 100. For example, the memory controller 20 may provide the command signal CMD, the address signal ADDR, and the data DT to the master semiconductor die 100, and the master semiconductor die 100 may provide the command signal CMD, the address signal ADDR, and the data DT to the plurality of slave semiconductor dies 200-1~200-n through the TSVs.

In addition, the master semiconductor die 100 receives a first power supply voltage VDD1 and a second power supply voltage VDD2 from outside of the stacked memory device 10, and provide the first power supply voltage VDD1 to the plurality of slave semiconductor dies 200-1~200-n through the TSVs.

The memory device included in the master semiconductor die 100 and each of the plurality of slave semiconductor dies 200-1~200-n operates using the first power supply voltage VDD1.

In this exemplary embodiment, the master semiconductor die 100 does not provide the second power supply voltage VDD2 to the plurality of slave semiconductor dies 200-1~200-n, but uses the second power supply voltage VDD2 to communicate the data DT with the memory controller 20.

In some example embodiments, the stacked memory device 10 may be packaged with the memory controller 20 in a chip-on-chip structure, and the stacked memory device 10 and the memory controller 20 are electrically connected through bonding wires and/or TSVs.

In other example embodiments, the memory controller 20 may be mounted on a printed circuit board, the stacked memory device 10 may be mounted on a module substrate, and the module substrate may be inserted in a module slot that is mounted on the printed circuit board. The stacked memory device 10 and the memory controller 20 are electrically connected to each other through signal path of the printed circuit board.

In this exemplary embodiment, the stacked memory device 10 included in the memory system 700 of FIG. 12 may be implemented with the stacked memory device 10 of FIGS. 1 and 2. A structure and an operation of the stacked memory device 10 of FIGS. 1 and 2 are described above with reference to FIGS. 1 to 11. Therefore, detailed description of the stacked memory device 10 included in the memory system 700 of FIG. 12 will be omitted.

Figure 13:
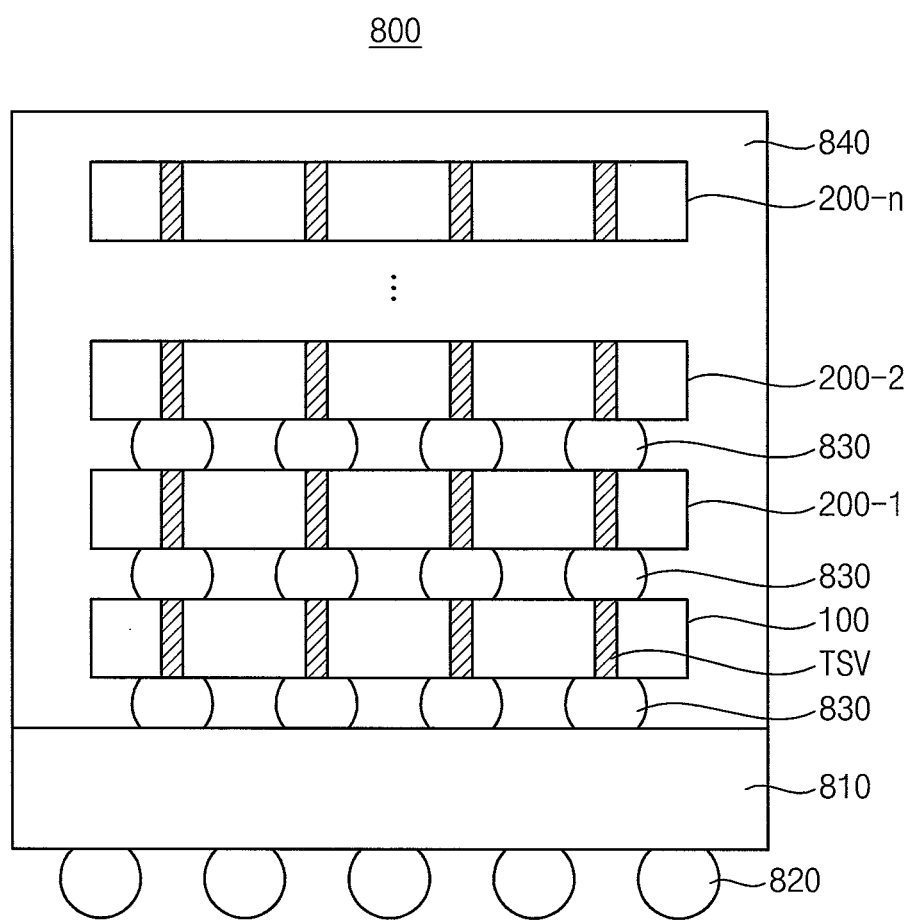
FIG. 13 is a block diagram illustrating a memory package according to example embodiments.

FIG. 13 is a block diagram illustrating a memory package according to example embodiments.

Referring to FIG. 13, a memory package 800 includes a base substrate 810, a master semiconductor die 100, and a plurality of slave semiconductor dies 200-1~200-n.

The master semiconductor die 100 may be stacked on the base substrate 810, and the plurality of slave semiconductor dies 200-1~200-n may be stacked on the master semiconductor die 100.

In some example embodiments, the base substrate 810 may be a printed circuit board.

Figure 15:
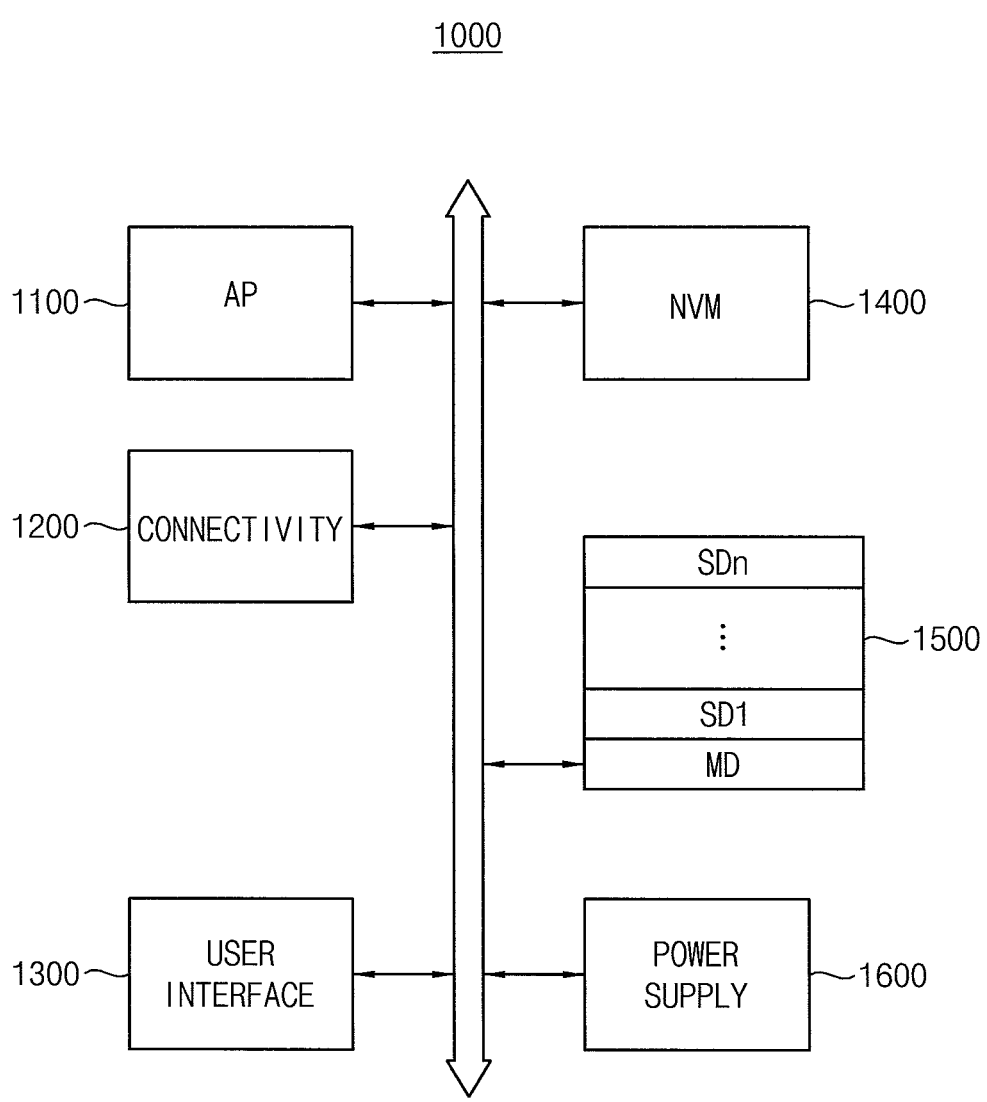
FIG. 15 is a block diagram illustrating an electronic device according to example embodiments.

External connecting members 820, e.g., conductive bumps, may be formed on a lower surface of the base substrate 810. The base substrate 810 may communicate signals with an external device through the external connecting members 820. For example, one of the external connecting members 820 may receive the first power supply voltage VDD1 from an external power source (e.g., power supply 1600 as illustrated in FIG. 15 below) and another one of the remaining external connecting members 820 may receive the second power supply voltage VDD2. In one embodiment, a value (e.g., voltage level) of the first power supply voltage VDD1 is the same as a value (e.g., corresponding voltage level) of the second power supply voltage VDD2. In another embodiment, a value (e.g., voltage level) of the first power supply voltage VDD1 is different from a value (e.g., corresponding voltage level) of the second power supply voltage VDD2. For example, a value (e.g., voltage level) of the first power supply voltage VDD1 may be larger than a value (e.g., corresponding voltage level) of the second power supply voltage VDD2.

Internal connecting members 830, e.g., conductive bumps, may be formed on an upper surface of the base substrate 810 and between the master semiconductor die 100 and the plurality of slave semiconductor dies 200-1~200-n. The base substrate 810, the master semiconductor die 100, and the plurality of slave semiconductor dies 200-1~200-n may be stacked through the internal connecting members 830. Each of the external connecting members 820 may independently connect to each of the internal connecting members 830.

In some example embodiments, the master semiconductor die 100 and the plurality of slave semiconductor dies 200-1~200-n are electrically connected to each other by TSVs to communicate with each other through the TSVs.

The master semiconductor die 100 and the plurality of slave semiconductor dies 200-1~200-n stacked on the base substrate 810 may be packaged using a sealing member 840.

The master semiconductor die 100 and the plurality of slave semiconductor dies 200-1~200-n included in the memory package 800 of FIG. 13 may be implemented with the master semiconductor die 100 and the plurality of slave semiconductor dies 200-1 and 200-2 included in the stacked memory device 10 of FIGS. 1 and 2. A structure and an operation of the stacked memory device 10 of FIGS. 1 and 2 are described above with reference to FIGS. 1 to 11. Therefore, detailed description of the master semiconductor die 100 and the plurality of slave semiconductor dies 200-1~200-n included in the memory package 800 of FIG. 13 will be omitted.

Figure 14:
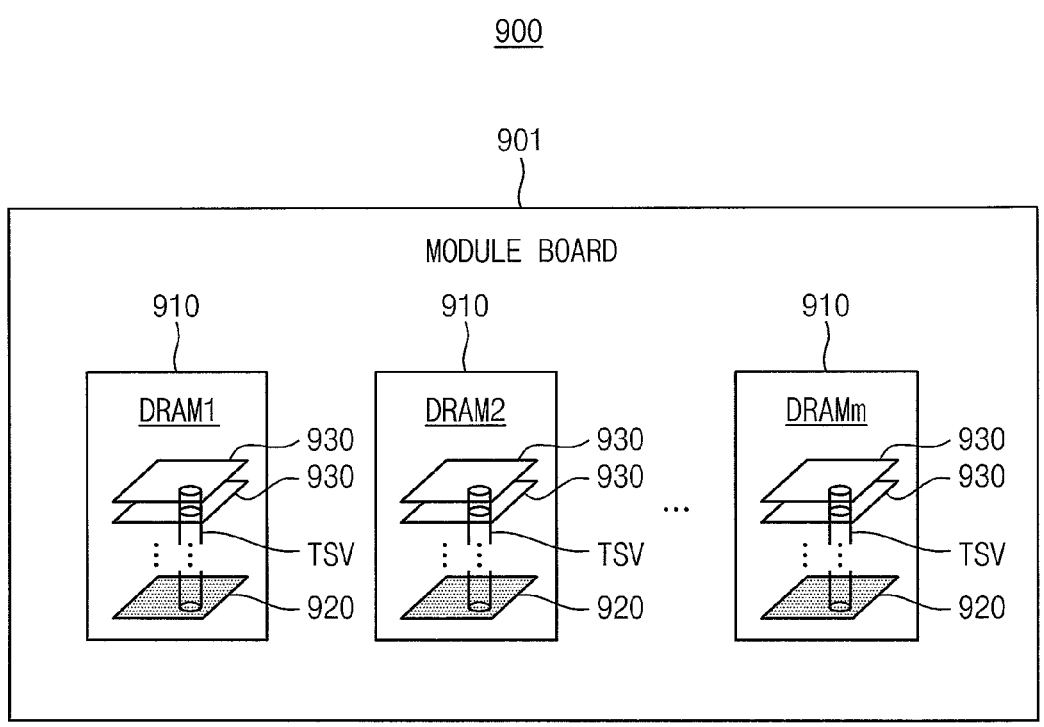
FIG. 14 is a block diagram illustrating a memory module according to example embodiments.

FIG. 14 is a block diagram illustrating a memory module according to example embodiments.

Referring to FIG. 14, a memory module 900 includes at least one memory package 910 mounted on a module board 901. For example, the memory package 910 may be implemented with a dynamic random access memory (DRAM) chip.

The memory package 910 may include a master semiconductor die 920 and a plurality of slave semiconductor dies 930 stacked on the master semiconductor die 920. The master semiconductor die 920 and the plurality of slave semiconductor dies 930 may be electrically connected to each other by TSVs to communicate with each other through the TSVs.

The memory package 910 included in the memory module 900 of FIG. 14 may be implemented with the memory package 800 of FIG. 13. A structure and an operation of the memory package 800 of FIG. 13 are described above with reference to FIGS. 1 to 13. Therefore, detailed description of the memory package 910 included in the memory module 900 of FIG. 14 will be omitted.

FIG. 15 is a block diagram illustrating an electronic device according to example embodiments.

Referring to FIG. 15, an electronic device 1000 includes an application processor AP 1100, a connectivity circuit 1200, a user interface 1300, a nonvolatile memory device NVM 1400, a volatile memory device 1500, and a power supply 1600. In some embodiments, the electronic device 1000 may be any types of electronic devices, such as a personal computer (PC), a laptop computer, a server computer, etc.

The application processor 1100 may execute applications, such as a web browser, a game application, a video player, etc. In some embodiments, the application processor 1100 may include a single core or multiple cores. For example, the application processor 1100 may be a multi-core processor, such as a dual-core processor, a quad-core processor, a hexa-core processor, etc. The application processor 1100 may include an internal or external cache memory.

The connectivity circuit 1200 may perform wired or wireless communication with an external device. For example, the connectivity circuit 1200 may perform Ethernet communication, near field communication (NFC), radio frequency identification (RFID) communication, mobile telecommunication, memory card communication, universal serial bus (USB) communication, etc. In some embodiments, connectivity unit 1200 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 1500 may include a master semiconductor die MD and a plurality of slave semiconductor dies SD1~SDn stacked on the master semiconductor die MD. The master semiconductor die MD and the plurality of slave semiconductor dies SD1~SDn may be electrically connected to each other by TSVs to communicate with each other through the TSVs. A communication of a signal and data between the volatile memory device 1500 and the application processor 1100 may be performed through the master semiconductor die MD, and the master semiconductor die MD may provide the signal and the data to the plurality of slave semiconductor dies SD1~SDn through the TSVs.

The volatile memory device 1500 included in the electronic device 1000 of FIG. 15 may be implemented with the stacked memory device 10 of FIGS. 1 and 2. A structure and an operation of the stacked memory device 10 of FIGS. 1 and 2 are described above with reference to FIGS. 1 to 11. Therefore, detailed description of the volatile memory device 1500 included in the electronic device 1000 of FIG. 15 will be omitted.

The nonvolatile memory device 1400 may store a boot image for booting the electronic device 1000. For example, the nonvolatile memory device 1400 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1300 may include at least one input device, such as a keypad, a touch screen, etc., and at least one output device, such as a speaker, a display device, etc.

The power supply 1600 may supply a power supply voltage to the electronic device 1000.

In some embodiments, the electronic device 1000 may further include an image processor, and/or a storage device, such as a memory card, a solid state drive (SSD), a hard disk drive (HDD), a CD-ROM, etc.

In some embodiments, the electronic device 1000 and/or components of the electronic device 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 16:
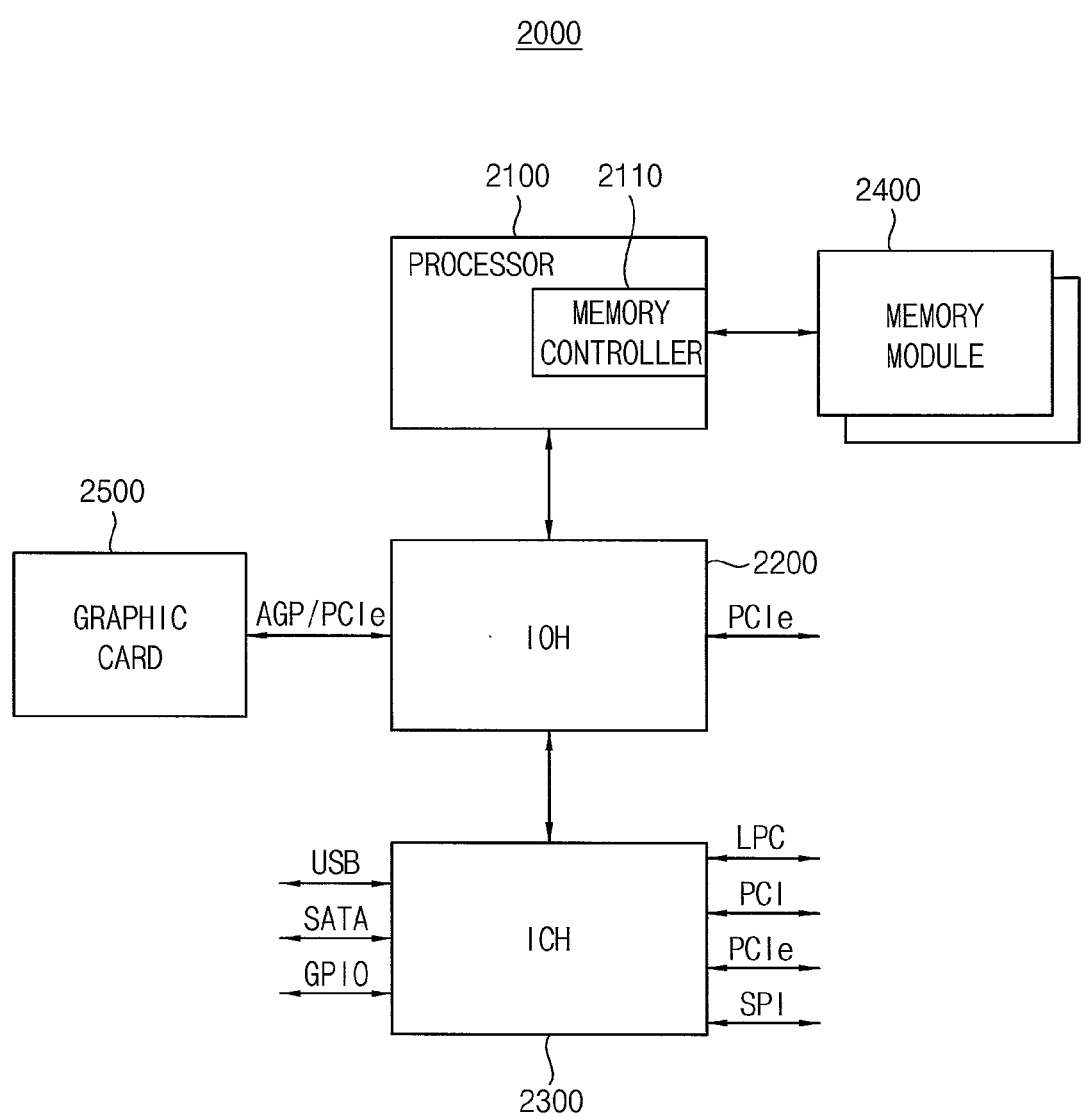
FIG. 16 is a block diagram illustrating a computing system according to exemplary embodiments.

FIG. 16 is a block diagram illustrating a computing system according to exemplary embodiments.

Referring to FIG. 16, a computing system 2000 includes a processor 2100, an input/output hub (IOH) 2200, an input/output controller hub (ICH) 2300, at least one memory module 2400, and a graphics card 2500. In some embodiments, the computing system 2000 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 2100 may perform various computing functions, such as executing specific software for performing specific calculations or tasks. For example, the processor 2100 may be a microprocessor, a central process unit (CPU), a digital signal processor, or the like. In some embodiments, the processor 2100 may include a single core or multiple cores. For example, the processor 2100 may be a multi-core processor, such as a dual-core processor, a quad-core processor, a hexa-core processor, etc. Although FIG. 16 illustrates the computing system 2000 including one processor 2100, in some embodiments, the computing system 2000 may include a plurality of processors.

The processor 2100 may include a memory controller 2110 for controlling operations of the memory module 2400. The memory controller 2110 included in the processor 2100 may be referred to as an integrated memory controller (IMC). A memory interface between the memory controller 2110 and the memory module 2400 may be implemented with a single channel including a plurality of signal lines, or may bay be implemented with multiple channels, to each of which at least one memory module 2400 may be coupled. In some embodiments, the memory controller 2110 may be located inside the input/output hub 2200. The input/output hub 2200 including the memory controller 2110 may be referred to as memory controller hub (MCH).

The memory module 2400 included in the computing system 2000 of FIG. 16 may be implemented with the memory module 900 of FIG. 14. A structure and an operation of the memory module 900 of FIG. 14 are described above with reference to FIGS. 1 to 14. Therefore, detailed description of the memory module 2400 included in the computing system 2000 of FIG. 16 will be omitted.

The input/output hub 2200 may manage data transfer between processor 2100 and devices, such as the graphics card 2500. The input/output hub 2200 may be coupled to the processor 2100 via various interfaces. For example, the interface between the processor 2100 and the input/output hub 2200 may be a front side bus (FSB), a system bus, a HyperTransport, a lightning data transport (LDT), a QuickPath interconnect (QPI), a common system interface (CSI), etc. The input/output hub 2200 may provide various interfaces with the devices. For example, the input/output hub 2200 may provide an accelerated graphics port (AGP) interface, a peripheral component interface-express (PCIe), a communications streaming architecture (CSA) interface, etc. Although FIG. 16 illustrates the computing system 2000 including one input/output hub 2200, in some embodiments, the computing system 2000 may include a plurality of input/output hubs.

The graphics card 2500 may be coupled to the input/output hub 2200 via AGP or PCIe. The graphics card 2500 may control a display device for displaying an image. The graphics card 2500 may include an internal processor for processing image data and an internal memory device. In some embodiments, the input/output hub 2200 may include an internal graphics device along with or instead of the graphics card 2500 outside the graphics card 2500. The graphics device included in the input/output hub 2200 may be referred to as integrated graphics. Further, the input/output hub 2200 including the internal memory controller and the internal graphics device may be referred to as a graphics and memory controller hub (GMCH).

The input/output controller hub 2300 may perform data buffering and interface arbitration to efficiently operate various system interfaces. The input/output controller hub 2300 may be coupled to the input/output hub 2200 via an internal bus, such as a direct media interface (DMI), a hub interface, an enterprise Southbridge interface (ESI), PCIe, etc.

The input/output controller hub 2300 may provide various interfaces with peripheral devices. For example, the input/output controller hub 2300 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 2100, the input/output hub 2200 and the input/output controller hub 2300 may be implemented as separate chipsets or separate integrated circuits. In other embodiments, at least two of the processor 2100, the input/output hub 2200 and the input/output controller hub 2300 may be implemented as a single chipset.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A stacked memory device, comprising:
a master semiconductor die including a first power line coupled to a first power supply voltage provided from outside of the stacked memory device, a second power line coupled to a second power supply voltage provided from outside of the stacked memory device, a first memory device coupled to the first power line, and a first data input/output buffer coupled to the second power line; and
a plurality of slave semiconductor dies stacked on the master semiconductor die, each of the plurality of slave semiconductor dies including a third power line, a fourth power line, and a second memory device coupled to the third power line,
wherein the third power line is electrically connected to the first power line, the fourth power line is electrically disconnected from the second power line, and the third power line is electrically connected to the fourth power line, and
wherein the first data input/output buffer is configured to buffer data communicated between an external device and the first memory device and the second memory device.

2. The stacked memory device of claim 1, wherein the third power line included in each of the plurality of slave semiconductor dies is electrically connected to the first power line included in the master semiconductor die by a through silicon via (TSV).

3. The stacked memory device of claim 1, wherein the master semiconductor die further includes a first ground line coupled to a first ground voltage provided from outside of the stacked memory device and a second ground line coupled to a second ground voltage provided from outside of the stacked memory device,
wherein each of the plurality of slave semiconductor dies further includes a third ground line electrically connected to the first ground line and a fourth ground line electrically disconnected from the second ground line, and
wherein the third ground line and the fourth ground line included in each of the plurality of slave semiconductor dies are electrically connected to each other through a connection structure.

4. The stacked memory device of claim 3, wherein the first memory device included in the master semiconductor die is coupled between the first power line and the first ground line, and operates using the first power supply voltage provided through the first power line,
wherein the first data input/output buffer included in the master semiconductor die is coupled between the second power line and the second ground line, and operates using the second power supply voltage provided through the second power line, and
wherein the memory device included in each of the plurality of slave semiconductor dies is coupled between the third power line and the third ground line, and operate using the first power supply voltage provided through the third power line and the fourth power line.

5. The stacked memory device of claim 3, wherein the master semiconductor die further includes:
a first capacitor coupled between the first power line and the first ground line; and
a second capacitor coupled between the second power line and the second ground line, and
wherein each of the plurality of slave semiconductor dies further includes:
a third capacitor coupled between the third power line and the third ground line; and
a fourth capacitor coupled between the fourth power line and the fourth ground line.

6. The stacked memory device of claim 1, wherein the first power line and the second power line included in the master semiconductor die are electrically disconnected from each other by a metal option formed in an open state, and
wherein the third power line and the fourth power line included in each of the plurality of slave semiconductor dies are electrically connected to each other by a metal option formed in a closed state.

7. The stacked memory device of claim 1, wherein each of the plurality of slave semiconductor dies further includes:
a first back surface pad formed on a back surface of a corresponding slave semiconductor die, the first back surface pad being coupled to the third power line through a first TSV; and
a second back surface pad formed on the back surface of the corresponding slave semiconductor die, the second back surface pad being coupled to the fourth power line through a second TSV,
wherein the first back surface pad and the second back surface pad are electrically connected to each other on the back surface of the corresponding slave semiconductor die.

8. The stacked memory device of claim 1, wherein the first power line included in the master semiconductor die is coupled to the third power line included in a slave semiconductor die, which is stacked on the master semiconductor die, through a first TSV, and is coupled to the fourth power line included in the slave semiconductor die, which is stacked on the master semiconductor die, through a second TSV, and
wherein the third power line included in a corresponding slave semiconductor die among the plurality of slave semiconductor dies is coupled to the third power line included in a slave semiconductor die, which is stacked on the corresponding slave semiconductor die, through a third TSV, and is coupled to the fourth power line included in the slave semiconductor die, which is stacked on the corresponding slave semiconductor die, through a fourth TSV.

9. The stacked memory device of claim 8, wherein at least a portion of the second power line is located perpendicularly below the second TSV and the first power line, and
wherein at least a portion of the fourth power line is located perpendicularly below the fourth TSV and the third power line.

10. The stacked memory device of claim 8, wherein the master semiconductor die further includes a first power switch coupled between the first power line and the second power line, and the first power switch is configured to enter into a turned off state in response to a first power control signal having a first logic level, and
wherein each of the plurality of slave semiconductor dies further includes a second power switch coupled between the third power line and the fourth power line, and the second power switch is configured to enter into a turned on state in response to a second power control signal having a second logic level.

11. The stacked memory device of claim 1, wherein the master semiconductor die and the plurality of slave semiconductor dies are electrically connected to each other through a TSV.

12. The stacked memory device of claim 11, wherein the master semiconductor die receives a command signal, an address signal, and data from the external device, and provides the command signal, the address signal, and the data to the plurality of slave semiconductor dies through the TSV.

13. The stacked memory device of claim 12, wherein the first data input/output buffer included in the master semiconductor die is coupled to the memory device included in each of the plurality of slave semiconductor dies through the TSV, and buffers data communicated between the external device and the memory device included in each of the plurality of slave semiconductor dies.

14. A memory package, comprising:
a base substrate configured to receive a first power supply voltage and a second power supply voltage;
a master semiconductor die stacked on the base substrate, the master semiconductor die is configured to receive the first power supply voltage and the second power supply voltage from the base substrate; and
a plurality of slave semiconductor dies stacked on the master semiconductor die,
wherein the master semiconductor die includes a first power line coupled to the first power supply voltage, a second power line coupled to the second power supply voltage, a memory device coupled to the first power line, and a data input/output circuit coupled to the second power line,
wherein each of the plurality of slave semiconductor dies includes a third power line electrically connected to the first power line, a fourth power line electrically disconnected from the second power line and electrically connected to the third power line, and a memory device coupled to the third power line, and
wherein the data input/output circuit included in the master semiconductor die is configured to buffer data communicated between an external device and the memory devices included in the master semiconductor die and each of the plurality of slave semiconductor dies.

15. A stacked memory device, comprising:
a master semiconductor die including a first power line coupled to a first power supply voltage provided from outside of the stacked memory device, a second power line coupled to a second power supply voltage provided from outside of the stacked memory device, a first charge storage circuit and a first memory device both coupled to the first power line, and a first data input/output circuit coupled to the second power line, wherein the first memory device is provided in parallel with the first charge storage circuit; and
a plurality of slave semiconductor dies stacked on the master semiconductor die, each of the plurality of slave semiconductor dies including a third power line, a fourth power line, a third charge storage circuit coupled to the third power line and a second memory device coupled to the third power line, wherein the second memory device is provided in parallel with the third charge storage circuit,
wherein the third power line is electrically connected to the first power line, the fourth power line is electrically disconnected from the second power line, and the third power line is electrically connected to the fourth power line, and
wherein the first data input/output circuit is configured to buffer data communicated between an external device and the first memory device included in the master semiconductor die and the second memory device included in each of the plurality of slave semiconductor dies.

16. The stacked memory device of claim 15, wherein the master semiconductor die comprises a second charge storage circuit coupled to the second power line, and wherein the first data input/output circuit is provided in parallel with the second charge storage circuit and wherein the second charge storage circuit is configured to provide additional charge to the second power line to drive the first data input/output circuit when an operating voltage of the first data input/output circuit falls below the second power supply voltage.

17. The stacked memory device of claim 15, wherein each of the plurality of slave semiconductor dies further comprising a fourth charge storage circuit coupled to the fourth power line, wherein the fourth charge storage circuit is provided in parallel with the third charge storage circuit.

18. The stacked memory device of claim 17, wherein the second memory device is configured to be operated by using charges from both the third and fourth charge storage circuits when an operating voltage of the second memory device falls below the first power supply voltage.

19. The stacked memory device of claim 15, wherein the master semiconductor die further includes a first switch coupled between the first power line and the second power line, and the first switch is configured to be entered into a turned off state in response to a first power control signal having a first logic level, and wherein each of the plurality of slave semiconductor dies further includes a second switch coupled between the third power line and the fourth power line, and the second switch is configured to be entered into a turned on state in response to a second power control signal having a second logic level.

20. The stacked memory device of claim 15, wherein the first power line included in the master semiconductor die is coupled to the third power line included in a slave semiconductor die, which is stacked on the master semiconductor die, through a first through substrate via (TSV), and is coupled to the fourth power line included in the slave semiconductor die, which is stacked on the master semiconductor die, through a second TSV, and wherein the third power line included in a corresponding slave semiconductor die among the plurality of slave semiconductor dies is coupled to the third power line included in a slave semiconductor die, which is stacked on the corresponding slave semiconductor die, through a third TSV, and is coupled to the fourth power line included in the slave semiconductor die, which is stacked on the corresponding slave semiconductor die, through a fourth TSV.

* * * * *